(12) United States Patent
Yang et al.

(10) Patent No.: US 11,009,301 B2
(45) Date of Patent: May 18, 2021

(54) HEAT DISSIPATING FIN ASSEMBLY

(71) Applicant: DELTA ELECTRONICS, INC., Taoyuan (TW)

(72) Inventors: Shu-Cheng Yang, Taoyuan (TW); Shih-Chou Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/667,272

(22) Filed: Oct. 29, 2019

(65) Prior Publication Data

US 2020/0064082 A1 Feb. 27, 2020

Related U.S. Application Data

(63) Continuation-in-part of application No. 14/675,119, filed on Mar. 31, 2015, now abandoned.

(30) Foreign Application Priority Data

Jun. 27, 2014 (TW) ................................. 103122426

(51) Int. Cl.
*F28F 7/00* (2006.01)
*F28F 3/02* (2006.01)
(Continued)

(52) U.S. Cl.
CPC ................ *F28F 3/02* (2013.01); *F04D 25/06* (2013.01); *F04D 25/12* (2013.01); *F28F 2215/04* (2013.01); *F28F 2250/08* (2013.01)

(58) Field of Classification Search
CPC ................ H01L 23/467; H01L 23/3672; F28F 2215/04; F28F 2215/00; F28F 2250/08;
(Continued)

(56) References Cited

U.S. PATENT DOCUMENTS

| 5,957,194 A | 9/1999 | Azar |
| 6,229,701 B1 | 5/2001 | Kung et al. |

(Continued)

FOREIGN PATENT DOCUMENTS

| CN | 201476670 U | 5/2010 |
| CN | 103796463 A | 5/2014 |

(Continued)

*Primary Examiner* — Henry T Crenshaw
*Assistant Examiner* — Kamran Tavakoldavani
(74) *Attorney, Agent, or Firm* — Muncy, Geissler, Olds & Lowe, P.C.

(57) ABSTRACT

A heat dissipating fin assembly includes a bottom, a plurality of first heat dissipating fins, a plurality of second heat dissipating fins, an inner cover and an outer cover. The first heat dissipating fins extend from an inner end toward an outer end. The second heat dissipating fins are arranged between two of the first heat dissipating fins in staggered. The inner cover is disposed near the inner end and connected to the first heat dissipating fins. The outer cover is disposed near the outer end and connected to the second heat dissipating fins. The inner cover and the outer cover are separated to form an opening, and the dusts entering the heat dissipating fin assembly through the inner end are ejected via the opening. The second heat dissipating fins extend from around the opening to the outer end.

21 Claims, 23 Drawing Sheets

(51) Int. Cl.
*F04D 25/06* (2006.01)
*F04D 25/12* (2006.01)

(58) Field of Classification Search
CPC .... F28F 3/02; F28D 1/024; F28D 2021/0028; F04D 25/06; F04D 25/0613; F04D 25/12; F04D 29/4246; F04D 29/701
USPC ........................................................ 165/122
See application file for complete search history.

(56) References Cited

U.S. PATENT DOCUMENTS

| | | |
|---|---|---|
| 6,333,852 B1 | 12/2001 | Lin |
| 6,626,233 B1 | 9/2003 | Connors |
| 7,382,616 B2 | 6/2008 | Stefanoski |
| 2003/0155106 A1 | 8/2003 | Malone et al. |
| 2005/0248920 A1 | 11/2005 | Huang |
| 2006/0157222 A1 | 7/2006 | Chou |
| 2007/0131383 A1 | 6/2007 | Hattori et al. |
| 2008/0121374 A1 | 5/2008 | Wang et al. |
| 2009/0044927 A1* | 2/2009 | Hwang .................. G06F 1/203 165/80.3 |
| 2009/0147477 A1 | 6/2009 | Chao et al. |
| 2009/0321047 A1 | 12/2009 | Chen |
| 2010/0048120 A1 | 2/2010 | Chuang et al. |
| 2010/0084123 A1 | 4/2010 | Shishido et al. |
| 2011/0267777 A1 | 11/2011 | Oike et al. |
| 2011/0277969 A1* | 11/2011 | Chang .................. H01L 23/467 165/121 |
| 2011/0286178 A1* | 11/2011 | Bridges .................. F28F 3/048 361/679.54 |
| 2012/0063088 A1 | 3/2012 | Fu et al. |
| 2012/0175079 A1 | 7/2012 | Chang |
| 2012/0207618 A1 | 8/2012 | Horng |
| 2013/0021751 A1 | 1/2013 | Shiraga et al. |
| 2013/0027880 A1 | 1/2013 | Ito et al. |
| 2014/0099197 A1 | 4/2014 | Chen et al. |
| 2014/0118939 A1 | 5/2014 | Lin et al. |
| 2014/0168893 A1 | 6/2014 | Niu et al. |

FOREIGN PATENT DOCUMENTS

| | | |
|---|---|---|
| JP | 2008103440 A | 5/2008 |
| TW | I220914 B | 9/2004 |
| TW | 200426310 A | 12/2004 |
| TW | M292736 U | 6/2006 |
| TW | 200634494 A | 10/2006 |
| TW | 201213666 A | 4/2012 |

* cited by examiner

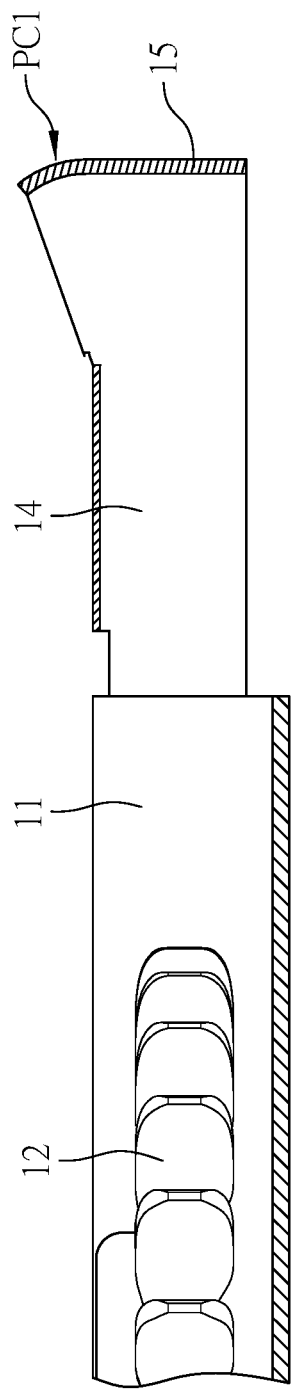
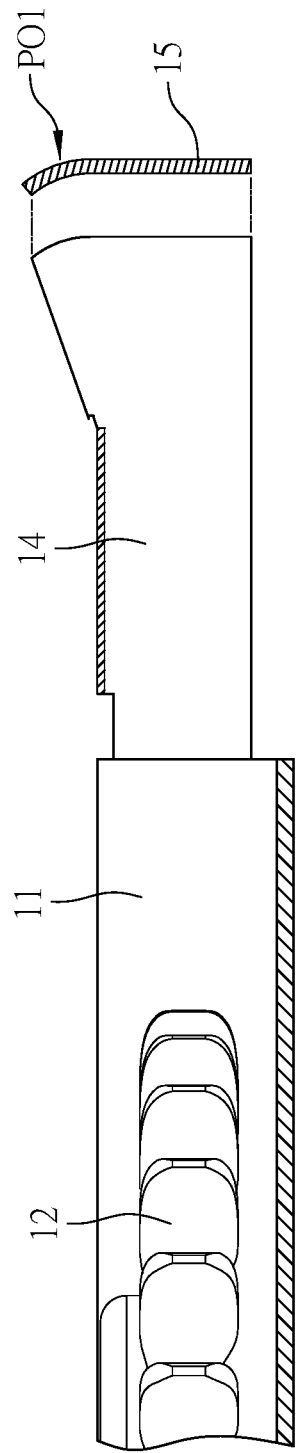

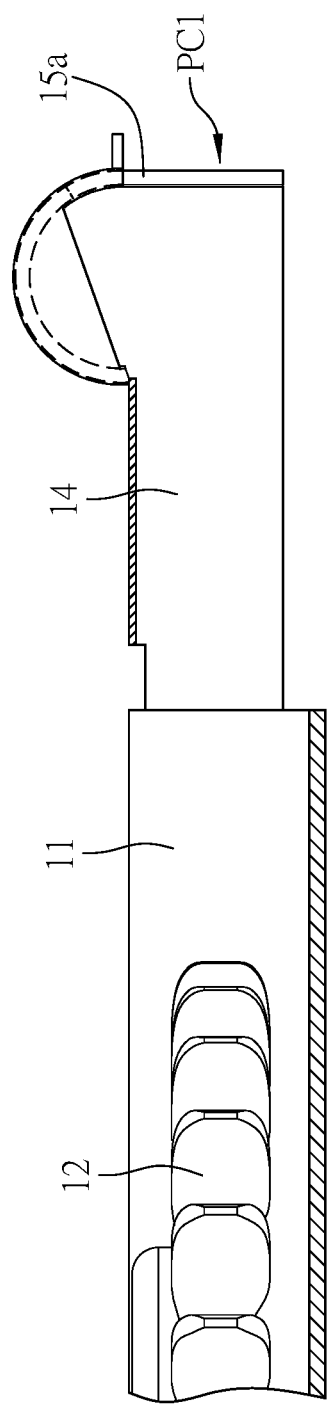
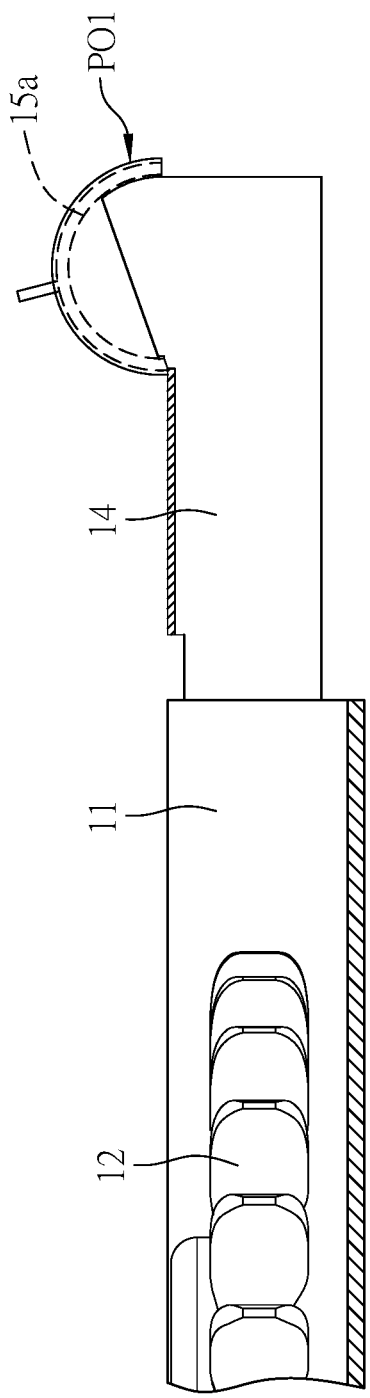
FIG. 5A
FIG. 5B

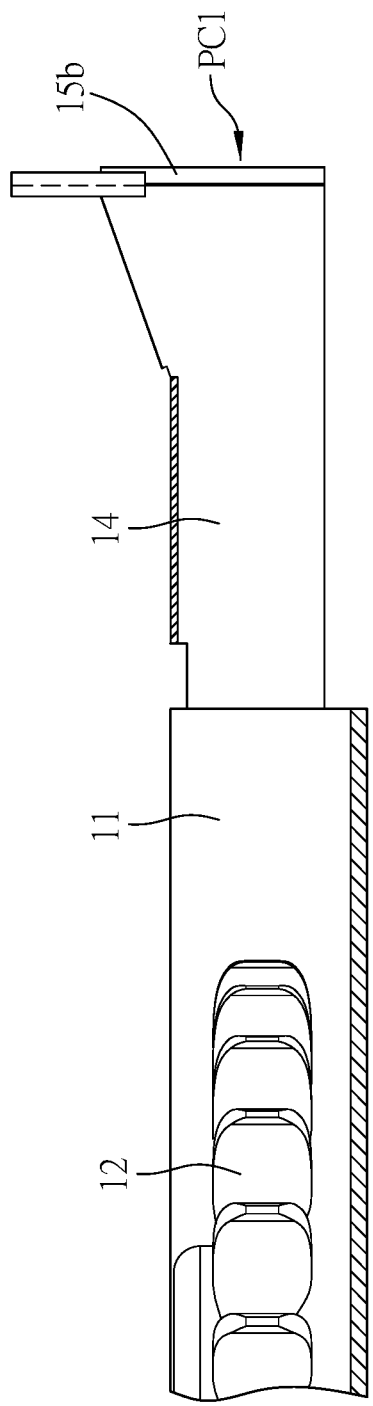
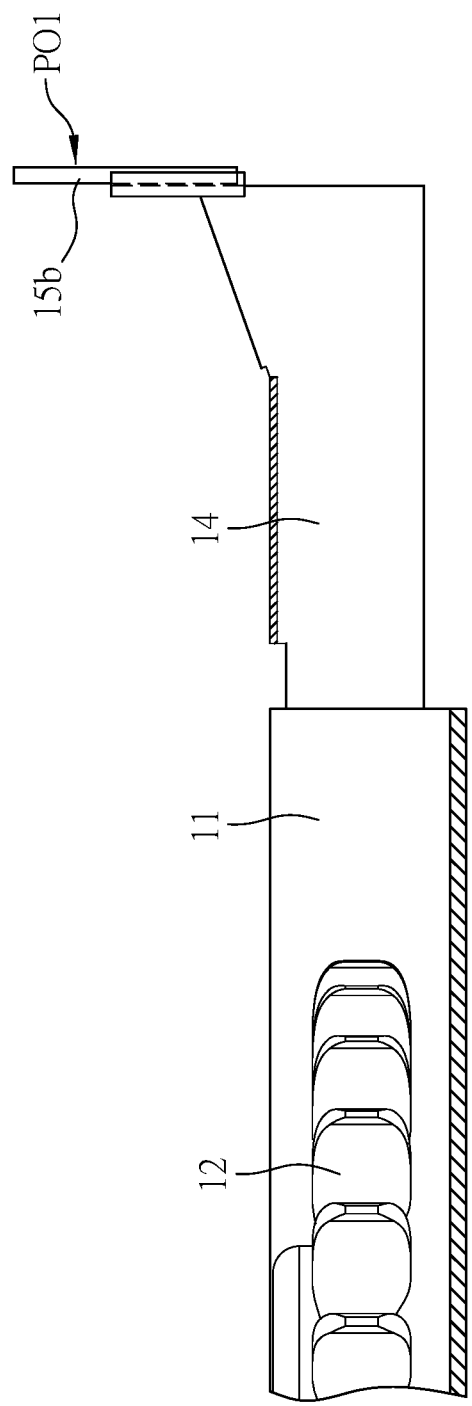

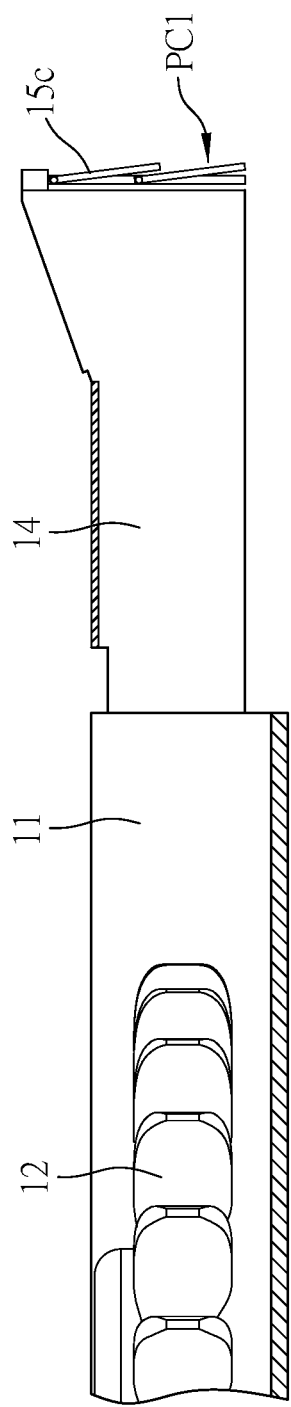
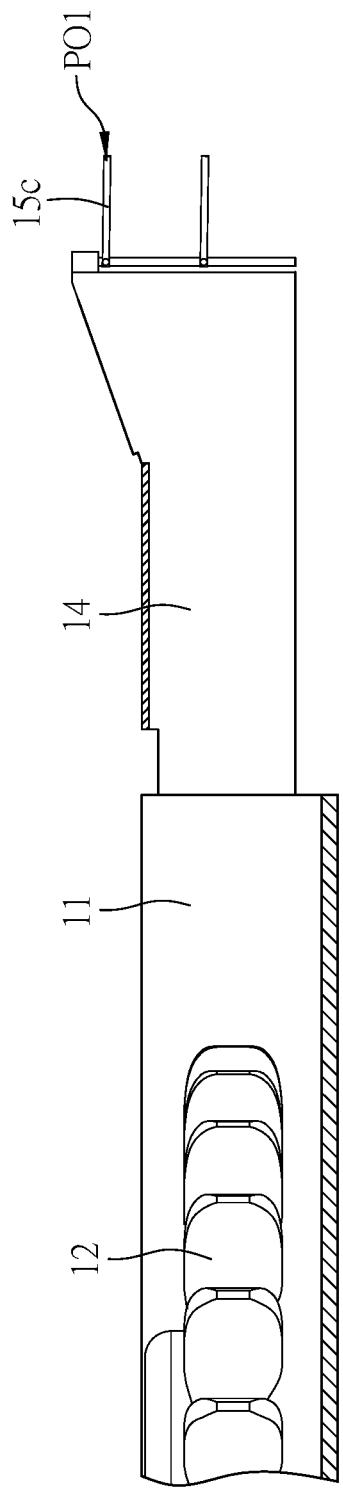

HEAT DISSIPATING FIN ASSEMBLY

CROSS REFERENCE TO RELATED APPLICATIONS

This application is a Continuation-In-Part (CIP) of an earlier filed, pending, application, having application Ser. No. 14/675,119 and filed on Mar. 31, 2015, the content of which, including drawings, is expressly incorporated by reference herein.

BACKGROUND OF THE INVENTION

Field of Invention

The present invention relates to a heat dissipating fin assembly and, in particular, to a heat dissipating fin assembly with dusting function.

Related Art

The electronic products are developed with higher performance, higher frequency, higher speed, and lighter and thinner structure. However, these features make the internal temperature of the electronic products become higher and higher, which may cause the product unstable and thus affect the reliability of the products. Therefore, the existing electronic products are usually equipped with a fan to dissipate the generated heat.

Regarding to a common heat-dissipating fan, the outlet of the fan located adjacent to the heat dissipating fin assembly will accumulate with great amount of dusts, which may come from the air. The accumulated dust can sufficiently affect the rotation speed and heat dissipating efficiency of the heat-dissipating fan.

Therefore, it is an important subject to provide a heat dissipating fin assembly which can provide a dusting function easily so as to improve the heat dissipating efficiency.

SUMMARY OF THE INVENTION

In view of the foregoing subject, an objective of the present invention is to provide a heat dissipating fin assembly which can provide a dusting function easily so as to improve the heat dissipating efficiency.

To achieve the above objective, the present invention discloses a heat dissipating fin assembly suitable for a fan, which includes a bottom, a plurality of first heat dissipating fins, a plurality of second heat dissipating fins, an inner cover and an outer cover. The heat dissipating fin assembly has an inner end adjacent to the fan and an outer end away from the fan. The first heat dissipating fins are disposed on the bottom side by side, aligned with the inner end, and extend from the inner end toward the outer end over a half of the bottom but not reaching the outer end. The second heat dissipating fins are disposed on the bottom and located between two of the first heat dissipating fins, aligned with the outer end, and extending from the outer end toward the inner end over a half of the bottom but not reaching the inner end. The inner cover is disposed at the inner end and connected to one side of the first heat dissipating fins away from the bottom. The outer cover is disposed at the outer end and connected to one side of the second heat dissipating fins away from the bottom. The second heat dissipating fins extend from around the opening to the outer end, and the length of the first heat dissipating fins is larger than that of the second heat dissipating fins.

In one embodiment, the outer cover and the inner cover are completely separated so as to form an opening between the outer cover and the inner cover, each of the second heat dissipating fins has a slant edge corresponding to the position of the opening, and the slant edge extends obliquely and upwardly from the inner end to the outer end.

In one embodiment, the fan is a centrifugal fan.

In one embodiment, any adjacent two of the first heat dissipating fins are interposed with one of the second heat dissipating fins.

In one embodiment, any adjacent two of the first heat dissipating fins are interposed with at least two of the second heat dissipating fins.

In one embodiment, any adjacent two of the first heat dissipating fins are interposed with an amount of the second heat dissipating fins.

In one embodiment, a hole is configured on a side wall of a fan frame of the fan adjacent to an outlet.

In one embodiment, any adjacent two of the first heat dissipating fins located close to the hole are interposed with less amount of the second heat dissipating fins, while any adjacent two of the first heat dissipating fins located away from the hole are interposed with greater amount of the second heat dissipating fins.

In one embodiment, the inner end of the heat dissipating fin assembly has a lower heat-dissipating-fin density to avoid accumulation of dusts, the outer end of the heat dissipating fin assembly has a higher heat-dissipating-fin density to maintain a larger heat dissipating surface area, and the higher heat-dissipating-fin density is higher than the lower heat-dissipating-fin density.

In one embodiment, the bottom is a bottom plate, the inner cover is an inner cover plate, and the outer cover is an outer cover plate.

In one embodiment, each of the first heat dissipating fins comprises a first fin body, a first bottom extension portion, a first inner cover extension portion and a first outer cover extension portion. The first bottom extension portion turns and extends from the first fin body to form a part of the bottom. The first inner cover extension portion is disposed at the inner end and connected to one side of the first fin body away from the first bottom extension portion to form a part of the inner cover. The first outer cover extension portion is disposed at the outer end and connected to one side of the first fin body away from the first bottom extension portion to form a part of the outer cover.

In one embodiment, each of the second heat dissipating fins comprises a second fin body, a second bottom extension portion and a second outer cover extension portion. The second bottom extension portion turns and extends from the second fin body to form a part of the bottom. The second outer cover extension portion is disposed at the outer end and connected to one side of the second fin body away from the second bottom extension portion to form a part of the outer cover.

In one embodiment, shapes of the first outer cover extension portion and the second outer cover extension portion are combined to obtain a rectangle, and the shape of the second outer cover extension portion is like word "L".

In one embodiment, each of the second heat dissipating fins has a slant edge corresponding to the position of the opening, and the slant edge extends obliquely and upwardly from the inner end to the outer end, a part of the slant edge of the second fin body is covered by the first inner cover extension portion of adjacent one of the first heat dissipating fins.

As mentioned above, the inner end of the heat dissipating fin assembly of the invention has lower density of heat dissipating structure (the first heat dissipating fins), and the outer end of the heat dissipating fin assembly has higher density of heat dissipating structure (including the first and second heat dissipating fins). The lower density heat dissipating structure at the inner end can avoid the accumulation of dusts, and the higher density heat dissipating structure at the outer end can maintain a larger heat dissipating surface area. The heat dissipating fin assembly further includes an inner cover plate and an outer cover plate, and an opening is defined between the inner and outer cover plates. As a result, the dusts can be exhausted through the opening, thereby achieving the effects of dusting and improved heat dissipating efficiency.

In another embodiment, the inner end of the heat dissipating fin assembly has lower density of heat dissipating structure (the first fin bodies), and the outer end of the heat dissipating fin assembly has higher density of heat dissipating structure (including the first and second fin bodies). In addition, the first inner cover extension portion, the first outer cover extension portion and the second outer cover extension portion form an opening. This configuration can also provide a lower density heat dissipating structure at the inner end to avoid the accumulation of dusts, and a higher density heat dissipating structure at the outer end to maintain a larger heat dissipating surface area. Besides, the dusts entering the heat dissipating fin assembly through the inner end can be ejected via the opening.

BRIEF DESCRIPTION OF THE DRAWINGS

The present invention will become more fully understood from the subsequent detailed description and accompanying drawings, which are given by way of illustration only, and thus are not limitative of the present invention, and wherein:

FIG. 4A is a sectional diagram of the heat dissipating device of FIG. 3 along the line A-A;

FIG. 4B is a schematic diagram showing the operation of the heat dissipating device of FIG. 4A;

FIG. 5A is a sectional diagram of another aspect of the heat dissipating device of FIG. 4A;

FIG. 5B is a schematic diagram showing the operation of the heat dissipating device of FIG. 5A;

FIG. 6A is a sectional diagram of another aspect of the heat dissipating device of FIG. 4A;

FIG. 6B is a schematic diagram showing the operation of the heat dissipating device of FIG. 6A;

FIG. 7A is a sectional diagram of another aspect of the heat dissipating device of FIG. 4A;

FIG. 7B is a schematic diagram showing the operation of the heat dissipating device of FIG. 7A;

DETAILED DESCRIPTION OF THE INVENTION

The present invention will be apparent from the following detailed description, which proceeds with reference to the accompanying drawings, wherein the same references relate to the same elements.

Figure 1:
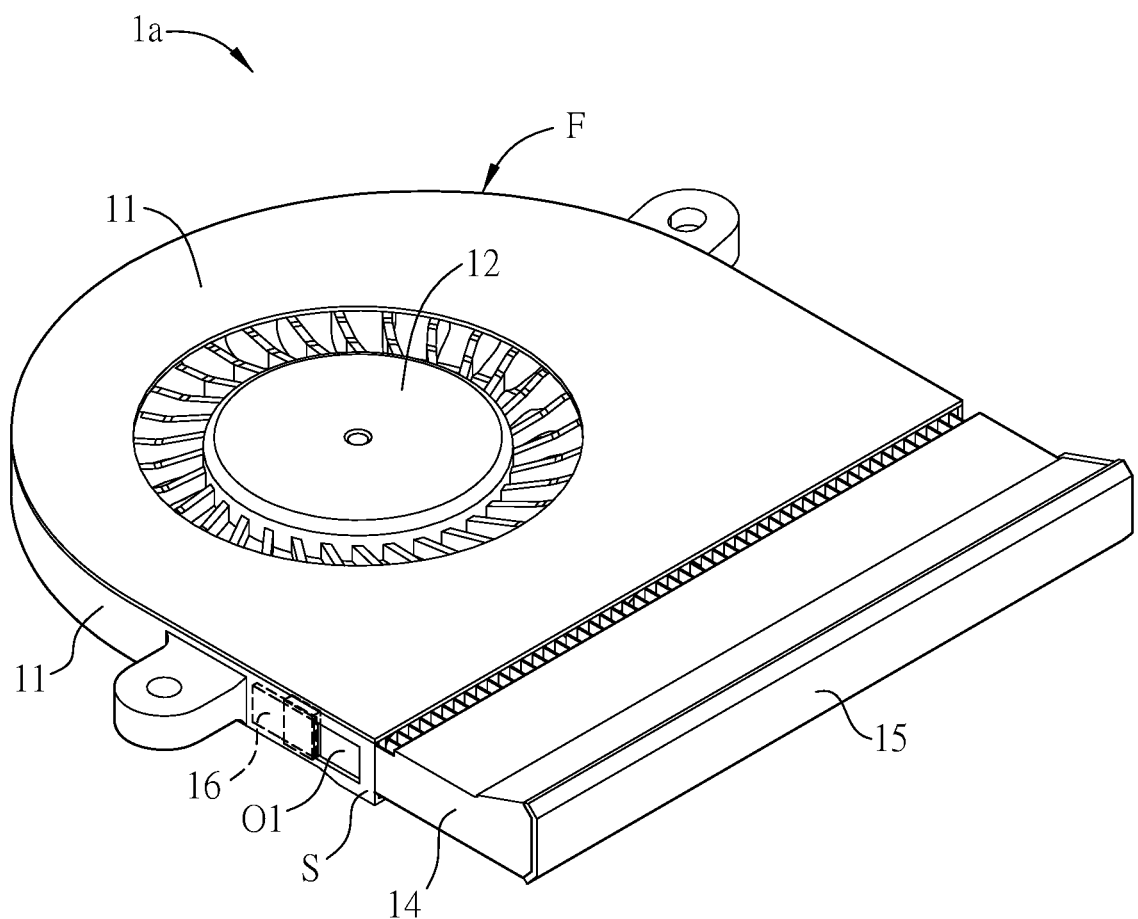
FIG. 1 is a schematic diagram showing an assembled heat dissipating device according to an embodiment of the invention.
Figure 2:
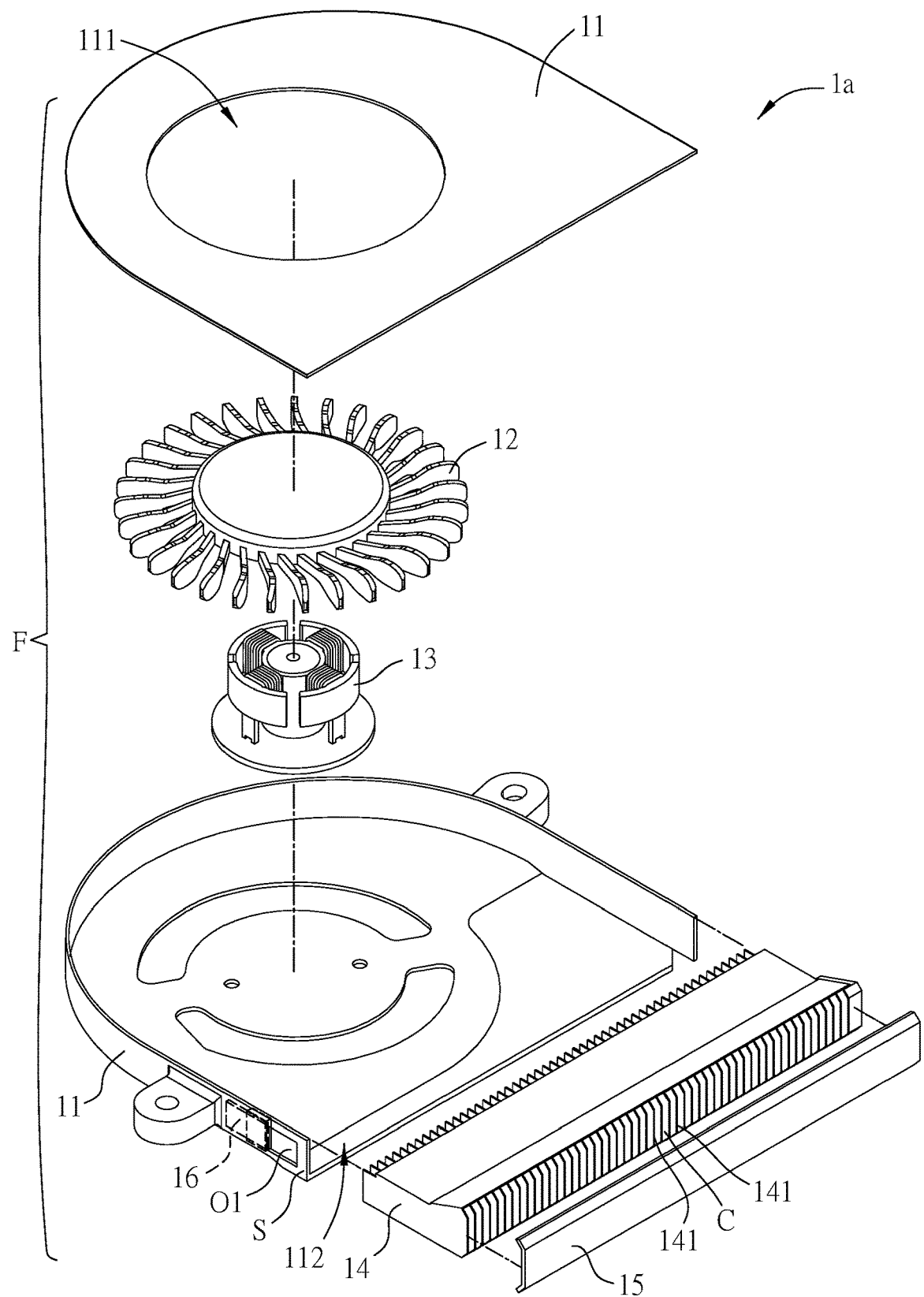
FIG. 2 is an exploded view of the heat dissipating device of FIG. 1.
Figure 3:
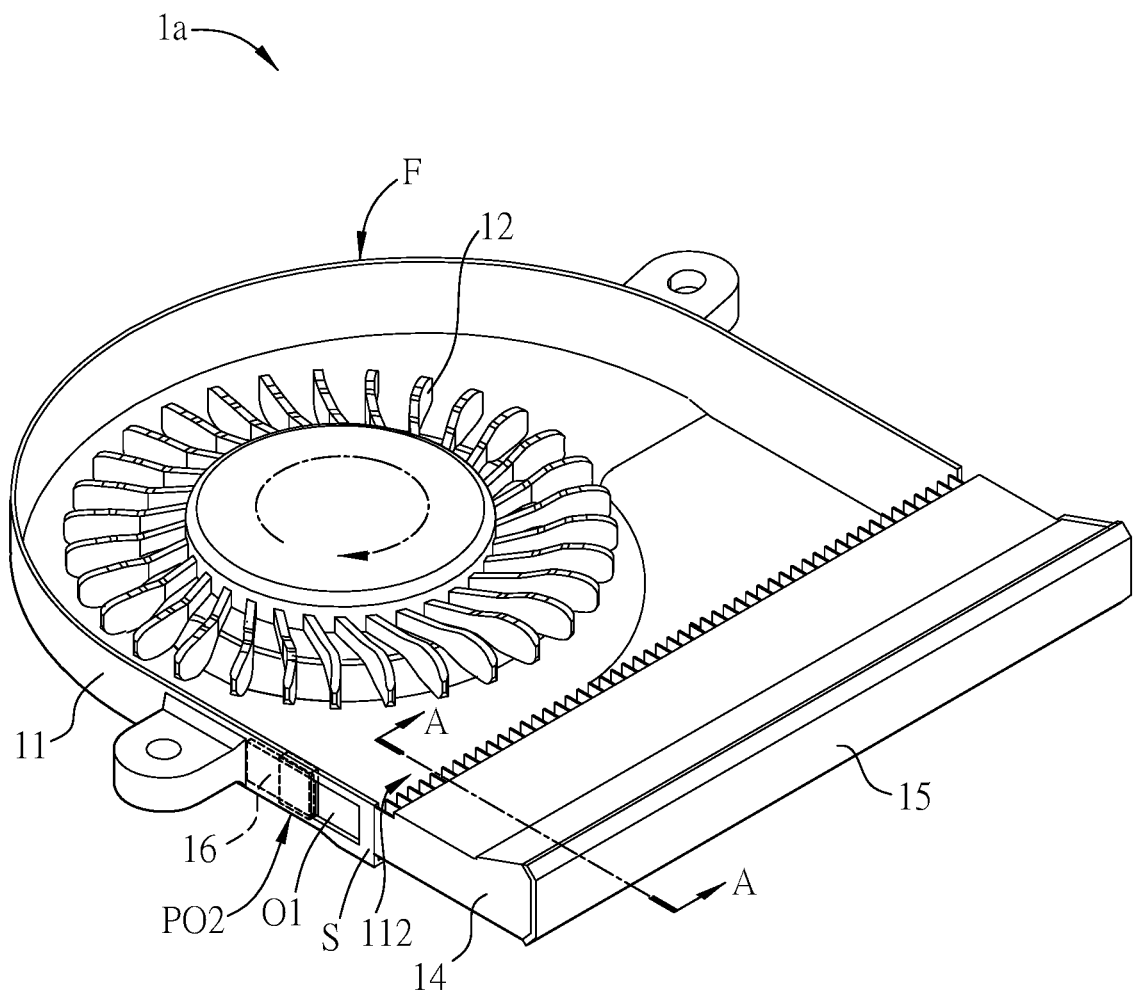
FIG. 3 is a schematic diagram showing a part of the assembled heat dissipating device of FIG. 1.

FIG. 1 is a schematic diagram showing an assembled heat dissipating device 1a according to an embodiment of the invention, FIG. 2 is an exploded view of the heat dissipating device 1a of FIG. 1, and FIG. 3 is a schematic diagram showing a part of the assembled heat dissipating device 1a of FIG. 1. Referring to FIGS. 1 and 2, the heat dissipating device 1a of this embodiment includes a fan F, a heat dissipating fin assembly 14 and a block 15. The fan F includes a fan frame 11, an impeller 12 and a motor 13. The motor 13 is disposed in the fan frame 11. The impeller is mounted on the motor 13, so that the motor 13 is connected to the impeller 12 and drives it to rotate. The fan frame 11 has an inlet 111 and an outlet 112. The heat dissipating fin assembly 14 is disposed at the position of the outlet 112 for dissipating heat. The heat dissipating fin assembly 14 is composed of a plurality of heat dissipating fins 141, which are arranged side by side, and any two of the heat dissipating fins 141 form a heat dissipating channel C. Accordingly, the heat dissipating fin assembly 14 has a plurality of heat dissipating channel C for dissipating heat from the heat dissipating device 1a. In practice, since the air usually contains a lot of dusts, the dusts may be accumulated at one side of the heat dissipating fin assembly 14 adjacent to the impeller 12 when the air in the heat dissipating device 1a flows through the heat dissipating fin assembly 14. In other words, the dusts accumulate at the joint position of the outlet 112 and the heat dissipating fin assembly 14.

The invention will be described in detail with reference to FIGS. 2 and 3 hereinafter, wherein some components (a part of the fan frame) are omitted in FIG. 3 for making the illustration more clear. In order to perform a dusting process, the block 15 of the embodiment shields the heat dissipating channels C, so that the air cannot be exhausted through the heat dissipating channels C. In practice, the block 15 can movably connect with the heat dissipating fin assembly 14, and the detailed aspects thereof will be discussed later. Of course, the block 15 may not connect with the heat dissipating fin assembly 14. That is, the block 15 is an independent component disposed close to the heat dissipating fin assembly 14 for shielding the heat dissipating channels C. Alternatively, the block 15 can be a part of another device that can also be disposed close to the heat dissipating channels C for shielding them.

Referring to FIG. 3, a hole O1 is configured on a side wall S of the fan frame 11 adjacent to the outlet 112. Since the block 15 blocks the air inside the heat dissipating device 1a, the air will flow within the heat dissipating device 1a continuously so as to from a higher pressure zone. At the same time, the hole O1 connecting to the outside of the heat dissipating device 1a forms a lower pressure zone. Thus, the air naturally flows from the higher pressure zone to the lower pressure zone so as to blow the dusts accumulated at the joint position of the outlet 112 and the heat dissipating fin assembly 14 to the hole O1, thereby exhausting the dusts through the hole O1 and thus achieving the goal of dusting.

FIG. 4A is a sectional diagram of the heat dissipating device 1a of FIG. 3 along the line A-A, and FIG. 4B is a schematic diagram showing the operation of the heat dissipating device 1a of FIG. 4A. Referring to FIGS. 4A and 4B, the block 15 is movably connected with the heat dissipating fin assembly 14, so it can move between a first open position PO1 and a first close position PC1. When the block 15a is located at the first closing position PC1 (see FIG. 5A), the block 15 shields the heat dissipating channels C of the heat dissipating fin assembly 14 (see FIG. 2) so as to stop the air in the heat dissipating device 1a from flowing through the heat dissipating channels C.

FIG. 5A is a sectional diagram of another aspect of the heat dissipating device of FIG. 4A, and FIG. 5B is a schematic diagram showing the operation of the heat dissipating device of FIG. 5A. Referring to FIGS. 5A and 5B, different from the previous aspect as shown in FIG. 4A, the block 15a is a sliding cap structure, which includes a track and a cap. Accordingly, the cap can be controlled by hand or circuit to slide along the track to shield the heat dissipating fin assembly 14.

FIG. 6A is a sectional diagram of another aspect of the heat dissipating device of FIG. 4A, and FIG. 6B is a schematic diagram showing the operation of the heat dissipating device of FIG. 6A. Referring to FIGS. 6A and 6B, different from the previous aspect as shown in FIG. 4A, the block 15b is a rolling door structure, which can be controlled by hand or circuit to move downwardly for shielding the heat dissipating fin assembly 14. The other related descriptions can be referred to the above aspects, so the detailed description thereof will be omitted.

FIG. 7A is a sectional diagram of another aspect of the heat dissipating device of FIG. 4A, and FIG. 7B is a schematic diagram showing the operation of the heat dissipating device of FIG. 7A. Referring to FIGS. 7A and 7B, different from the previous aspect as shown in FIG. 4A, the block 15c is a shutter structure, which can be controlled by hand or circuit to rotate downwardly for shielding the heat dissipating fin assembly 14. The other related descriptions can be referred to the above aspects, so the detailed description thereof will be omitted.

In this embodiment, the block 15, 15a, 15b or 15c shields one side of the heat dissipating fin assembly 14 away from the impeller 12. In more detailed, the block 15, 15a, 15b or 15c can shield the outlets of the heat dissipating channels C.

In other embodiments, the block 15, 15a, 15b or 15c may shield one side of the heat dissipating fin assembly 14 adjacent to the impeller 12. That is, the block 15, 15a, 15b or 15c can shield the inlets of the heat dissipating channels C. No matter the block 15, 15a, 15b or 15c shields the inlets or outlets of the heat dissipating channels C, the air can be blocked inside the heat dissipating device 1a and cannot be exhausted through the heat dissipating channels C. Furthermore, the configuration of the hole can provide an excellent dusting effect.

Referring to FIG. 3 again, if the impeller 12 rotates clockwise and the outlet 112 faces downwardly, the hole O1 is located at a left side of the side wall S and adjacent to the outlet 112. Accordingly, the dusts accumulated at the joint position of the outlet 112 and the heat dissipating fin assembly 14 can be swept by the clockwise airflow and exhausted through the hole O1, thereby achieving the desired dusting effect.

Figure 8:
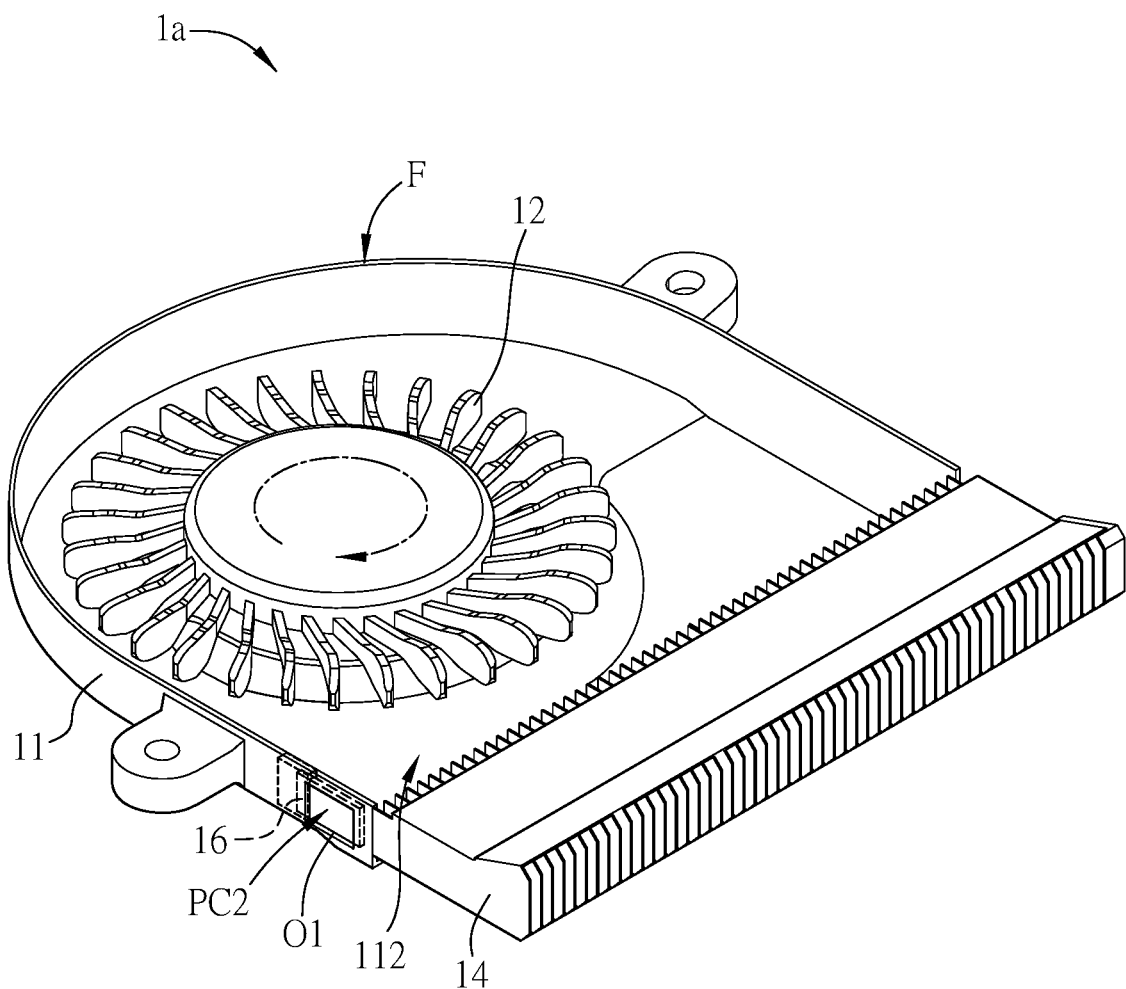
FIG. 8 is a schematic diagram showing the operation of the shielding member of FIG. 3.

In this embodiment, the heat dissipating device 1a further includes a shielding member 16 moveably connected to the edge of the hole O1. In more detailed, the shielding member 16 is disposed at a position of the side wall S adjacent to the hole O1. The shielding member 16 is movable between the second open position PO2 and the second close position PC2 (see FIG. 8). When the shielding member 16 is located at the second close position PC2, the shielding member 16 shields the hole O1. Herein, FIG. 8 is a schematic diagram showing the operation of the shielding member 16 of FIG. 3. In addition, the shielding member 16 can also be controlled by hand or circuit to move between the second open position PO2 (see FIG. 3) and the second close position PC2.

In practice, if the heat dissipating device 1a needs a dusting procedure, the block 15 is controlled to shield the heat dissipating channels C of the heat dissipating fin assembly 14 while the shielding member 16 does not shield the hole O1. Accordingly, the dusts accumulated at the joint position of the outlet 112 and the heat dissipating fin assembly 14 are blew to the hole O1, thereby exhausting the dusts through the hole O1 and thus achieving the goal of dusting. Regarding to the aspect as shown in FIG. 4A, 5A, 6A or 7A, when the heat dissipating device 1a needs a dusting procedure, the block 15, 15a, 15b or 15c moves to the first close position PC1 while the shielding member 16 is located at the second open position PO2 (see FIG. 3).

If the heat dissipating device 1a is in a normal operation and does not perform a dusting procedure, as shown in FIG. 8, the block 15 does not shield the heat dissipating channels C of the heat dissipating fin assembly 14 (see FIG. 2) while the shielding member 16 shields the hole O1. Regarding to the aspect as shown in FIG. 4B, 5B, 6B or 7B, when the heat dissipating device 1a does not perform a dusting procedure, the block 15, 15a, 15b or 15c moves to the first open position PO1 while the shielding member 16 is located at the second close position PC2 (see FIG. 8). Accordingly, the heat dissipating device 1a can dissipating heated airflow through the heat dissipating channels C of the heat dissipating fin assembly 14.

Figure 9:
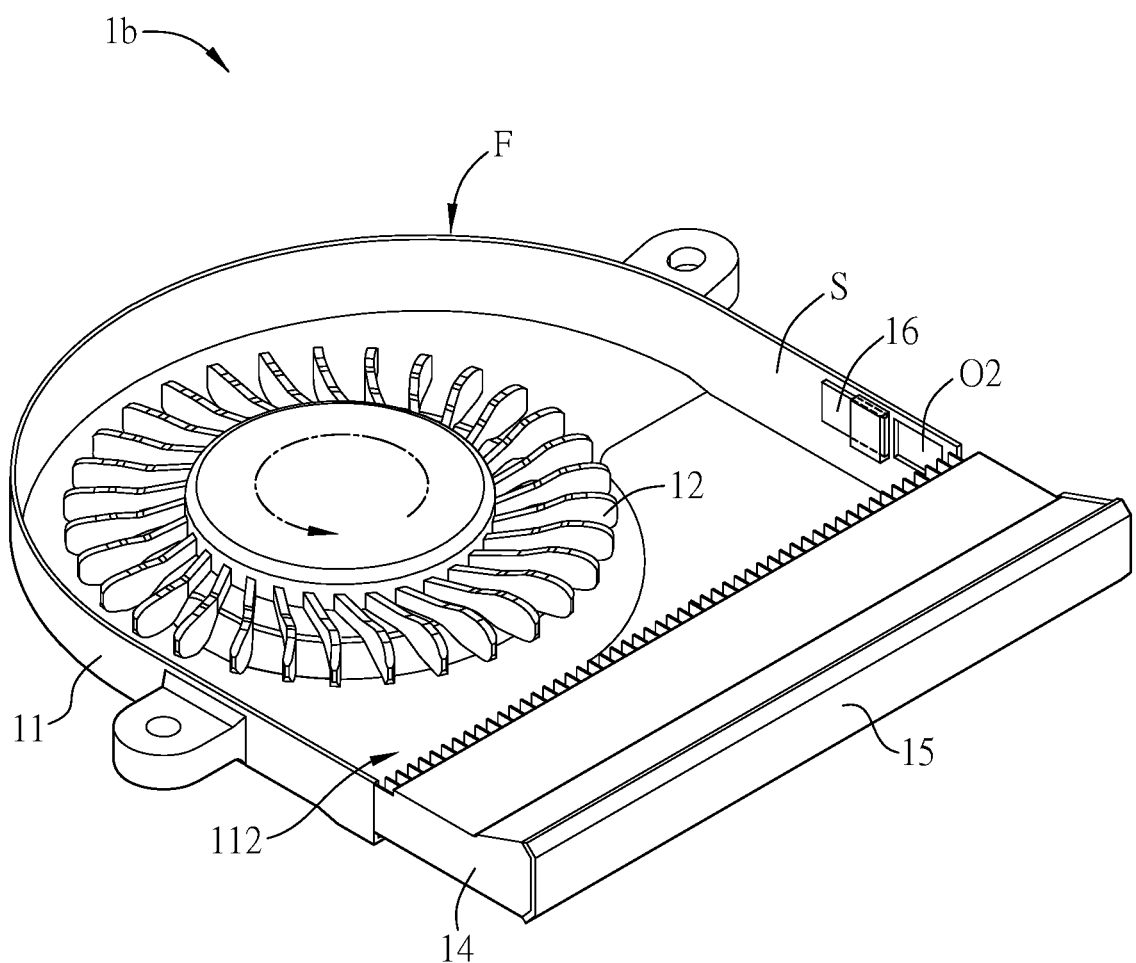
FIG. 9 is a schematic diagram showing a part of an assembled heat dissipating device according to another embodiment of the invention.

FIG. 9 is a schematic diagram showing a part of an assembled heat dissipating device 1b according to another embodiment of the invention. Different from the heat dissipating device 1a of the previous embodiment as shown in FIG. 3, the impeller 12 of the heat dissipating device 1b rotates counterclockwise, so that the hole O2 is located at the right side of the side wall S. In other words, when the impeller 12 rotates counterclockwise and the outlet 112 faces downwardly, the hole O2 is located at the right side of the side wall S and adjacent to the outlet 112. Accordingly, the dusts accumulated at the joint position of the outlet 112 and the heat dissipating fin assembly 14 can be swept by the counterclockwise airflow and exhausted through the hole O2. The other related descriptions can be referred to the above embodiment, so the detailed description thereof will be omitted. To be noted, the fan frame 11 may include both of the hole O1 disposed at the left side of the side wall S (see FIG. 3) and the hole O2 disposed at the right side of the side wall S (see FIG. 8) in cooperating with different rotation directions of the impeller 12 for performing dusting procedure.

Figure 10A:
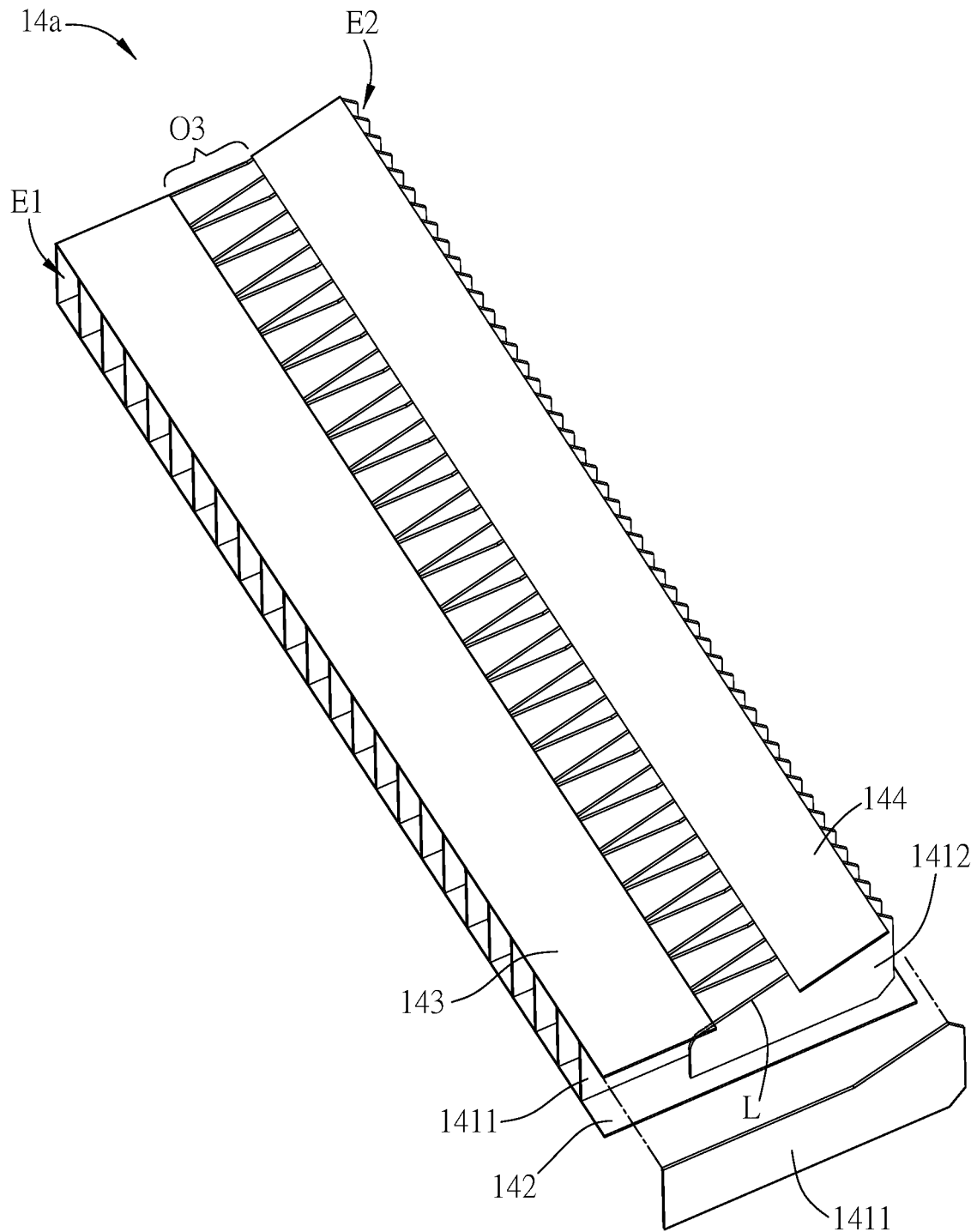
FIG. 10A is a schematic diagram showing a heat dissipating fin assembly according to an embodiment of the invention.
Figure 10B:
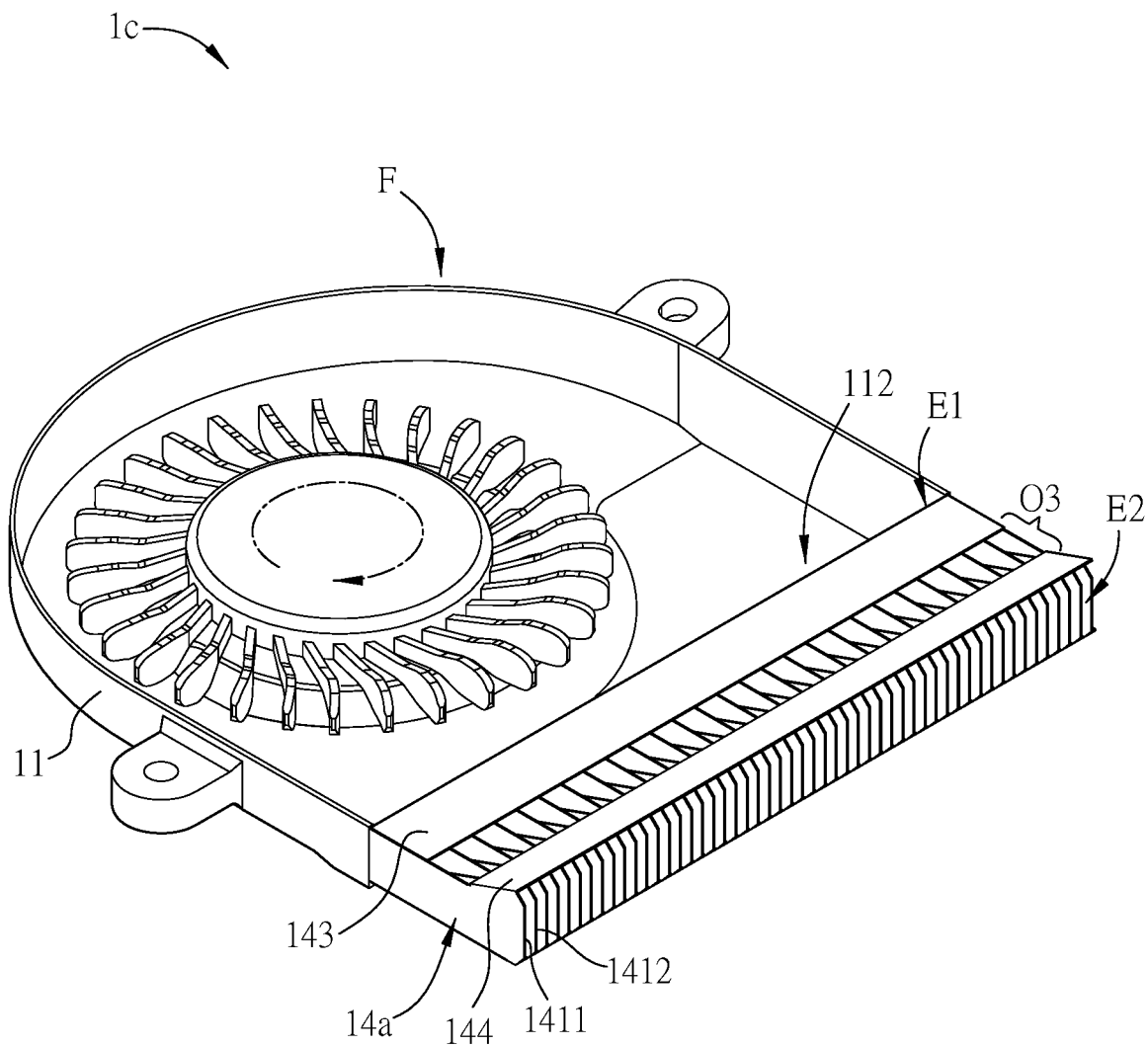
FIG. 10B is a schematic diagram showing an aspect of the heat dissipating fin assembly of FIG. 10A in cooperated with a fan.

FIG. 10A is a schematic diagram showing a heat dissipating fin assembly 14a according to an embodiment of the invention, and FIG. 10B is a schematic diagram showing an aspect of the heat dissipating fin assembly 14a of FIG. 10A in cooperated with a fan. Referring to FIGS. 10A and 10B, the heat dissipating fin assembly 14a of this embodiment is in cooperating with a fan F so as to form a heat dissipating device 1c. Herein, the fan F is preferably a centrifugal fan. The heat dissipating fin assembly 14a includes a bottom plate 142, a plurality of first heat dissipating fins 1411, a plurality of second heat dissipating fins 1412, an inner cover plate 143 and an outer cover plate 144. The heat dissipating fin assembly 14a has an inner end E1 close to the fan F and an outer end E2 away from the fan F. The first heat dissipating fins 1411 are disposed on the bottom plate 142 side by side and extend from an inner end E1 to an outer end E2. The second heat dissipating fins 1412 are disposed on the bottom plate 142 side by side and located between two first heat dissipating fins 1411, respectively. In more detailed, adjacent two first heat dissipating fins 1411 are interposed with a second heat dissipating fin 1412. The inner cover plate 143 is disposed at the inner end E1 and connected to one side of the first heat dissipating fins 1411 away from the bottom plate 142. The outer cover plate 144 is disposed at the outer end E2 and connected to one side of the second heat dissipating fins 1412 away from the bottom plate 142. The outer cover plate 144 and the inner cover plate 143 are separated so as to form an opening O3, and the second heat dissipating fins 1412 extend from around the opening O3 to the outer end E2. The length of the first heat dissipating fins 1411 is larger than that of the second heat dissipating fins 1412. Herein, the "length" represents the length of the first heat dissipating fins 1411 or the second heat dissipating fins 1412 in the direction from the inner end E1 to the outer end E2. According to the above structure, the inner end E1 of the heat dissipating fin assembly 14a has lower density of heat dissipating structure (the first heat dissipating fins), and the outer end E2 of the heat dissipating fin assembly 14a has higher density of heat dissipating structure (including the first and second heat dissipating fins). The lower density heat dissipating structure at the inner end E1 can avoid the accumulation of dusts at the joint between the heat dissipating fin assembly 14a and the outlet 112, and the higher density heat dissipating structure at the outer end E2 can maintain a larger heat dissipating surface area. The dusts entering the heat dissipating fin assembly 14a through the inner end E1 can be exhausted through the opening O3, thereby achieving the effects of dusting and improved heat dissipating efficiency.

In this embodiment, the second heat dissipating fin 1412 has a slant edge L corresponding to the position of the opening O3. The slant edge L extends obliquely and upwardly from the inner end E1 to the outer end E2. Accordingly, the dusts can be more easily ejected, along the slant edge L, through the opening O3.

Figure 10C:
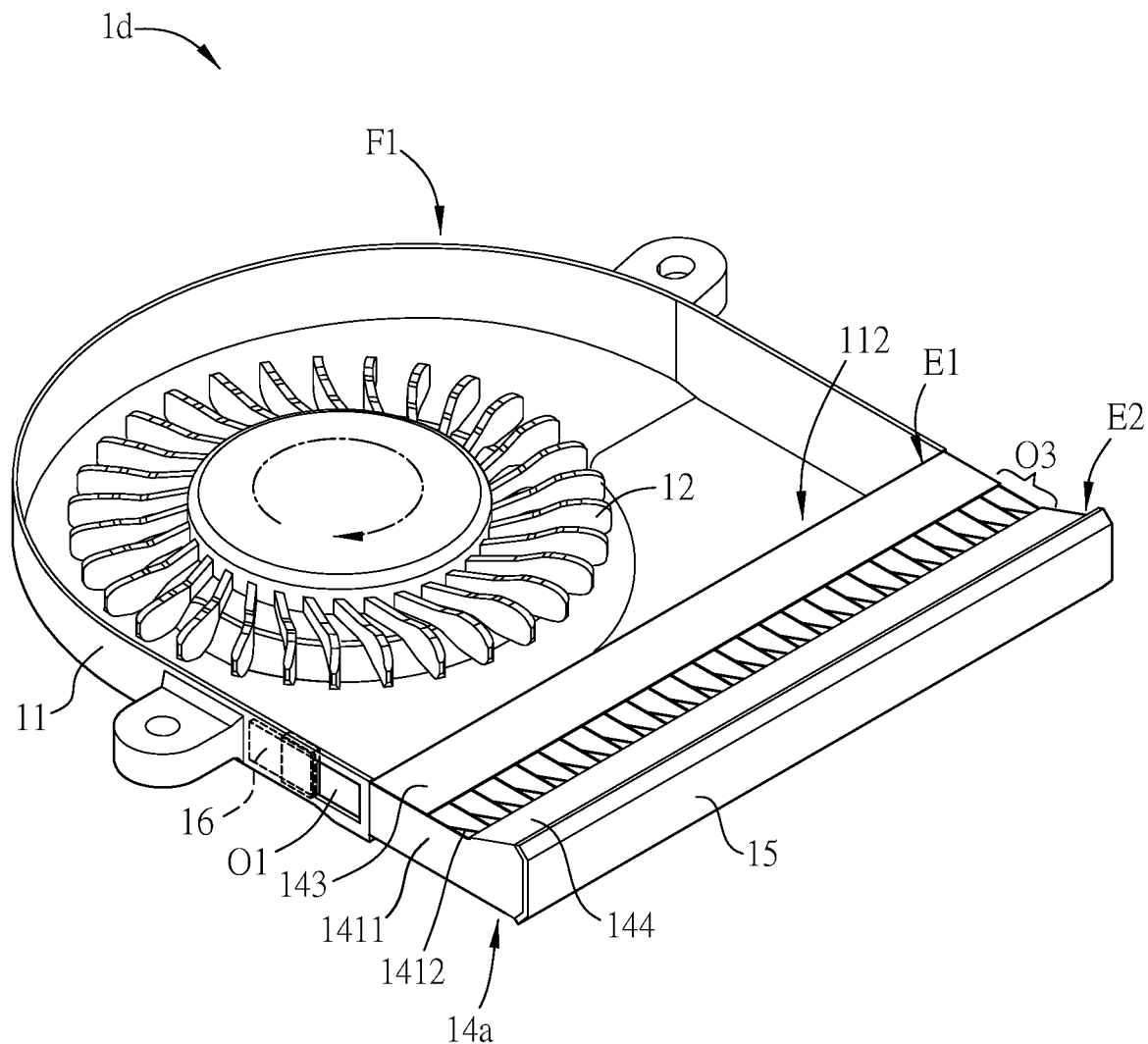
FIG. 10C is a schematic diagram showing another aspect of the heat dissipating fin assembly of FIG. 10A in cooperated with a fan.

FIG. 10C is a schematic diagram showing another aspect of the heat dissipating fin assembly 14a of FIG. 10A in cooperated with a fan. Different from the previous embodiment (the heat dissipating device 1c of FIG. 10B), the side wall S of the fan F1 has a hole O1 and the block 15 is disposed at the outer end E2 of the heat dissipating fin assembly 14a. The block 15 shields the heat dissipating channels of the heat dissipating fin assembly 14a, so that the dusts accumulated at the joint position of the outlet 112 and the heat dissipating fin assembly 14a are blew to the hole O1. In addition, the dusts entering the heat dissipating fin assembly 14a through the inner end E1 of the heat dissipating fin assembly 14a can be exhausted through the opening O3, thereby achieving a double dusting effect. The other related descriptions can be referred to the above embodiments, so the detailed description thereof will be omitted.

Figure 10D:
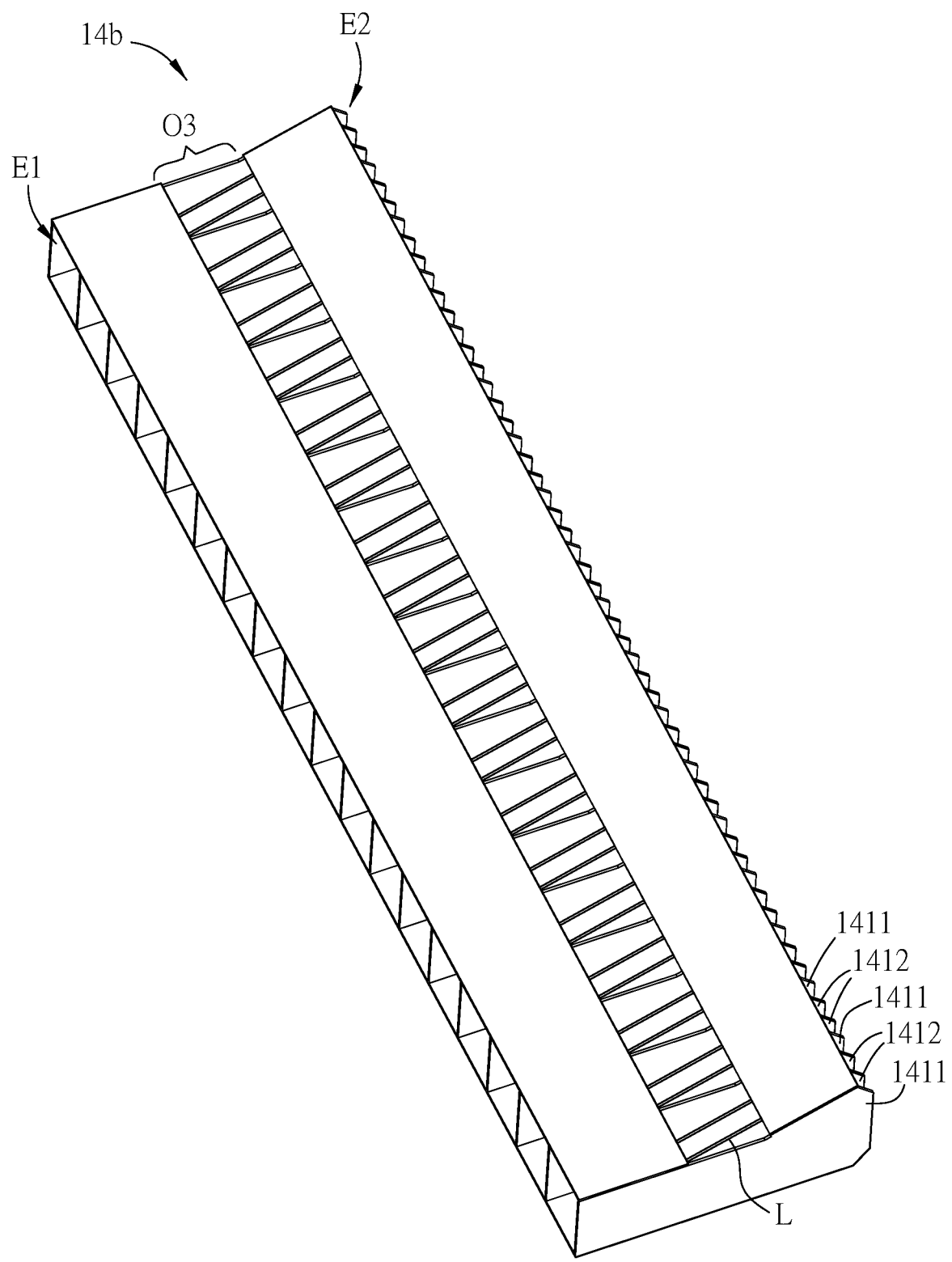
FIG. 10D is a schematic diagram showing another aspect of the heat dissipating fin assembly of FIG. 10A.

FIG. 10D is a schematic diagram showing another aspect of the heat dissipating fin assembly of FIG. 10A in cooperated with a fan. Different from the heat dissipating fin assembly 14a of FIG. 10A, in the heat dissipating fin assembly 14b of this aspect, adjacent two first heat dissipating fins 1411 are interposed with at least two of the second heat dissipating fins 1412. Of course, adjacent two first heat dissipating fins 1411 can be interposed with more second heat dissipating fins 1412. Accordingly, a larger interval can be formed around the inner end E1, so that the dusts entering the heat dissipating fin assembly 14b can be more easily ejected through the opening O3.

Figure 10E:
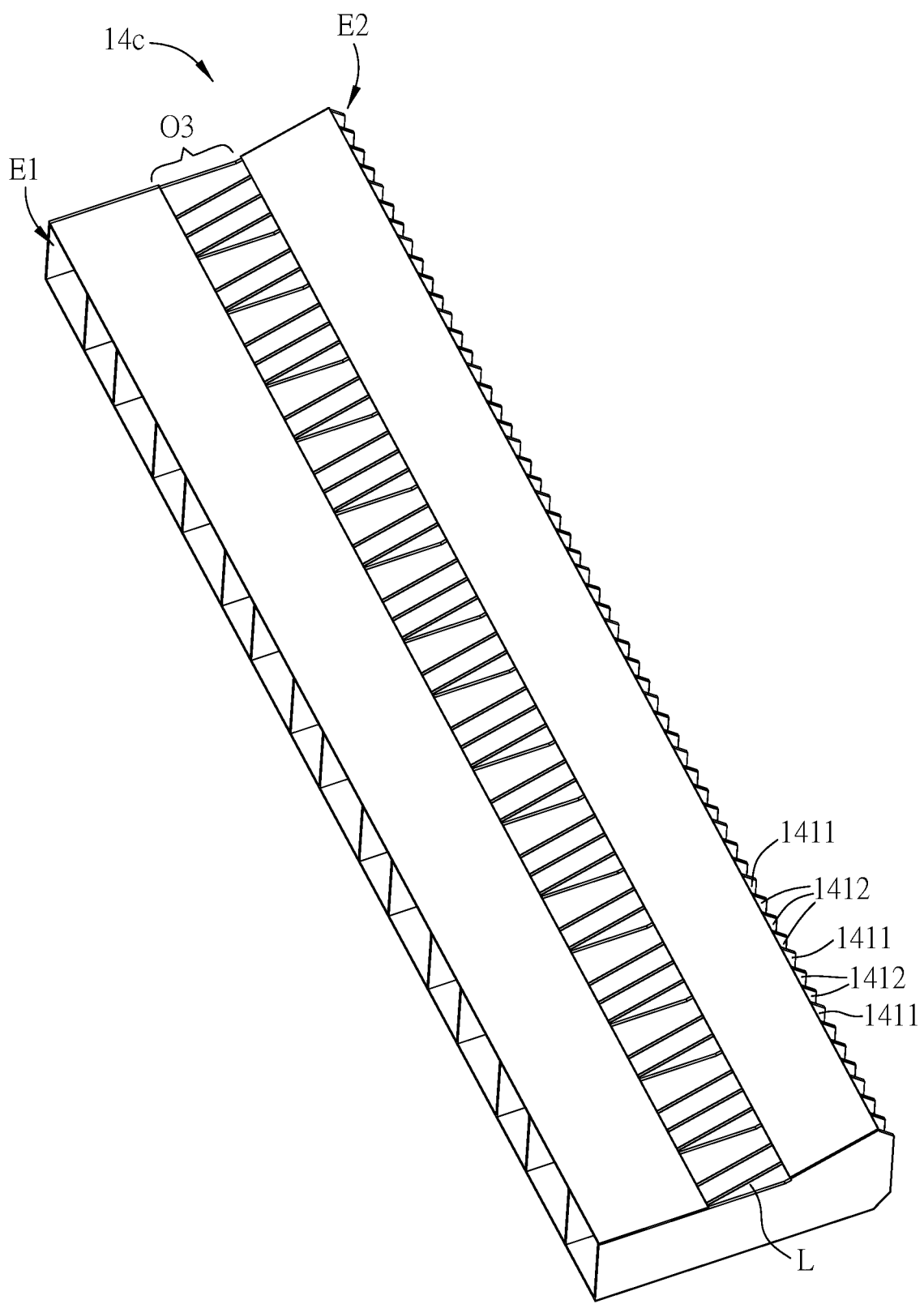
FIG. 10E is a schematic diagram showing another aspect of the heat dissipating fin assembly of FIG. 10A.

FIG. 10E is a schematic diagram showing another aspect of the heat dissipating fin assembly of FIG. 10A in cooperated with a fan. Different from the heat dissipating fin assembly 14a of FIG. 10A, in the heat dissipating fin assembly 14c of this aspect, adjacent two first heat dissipating fins 1411 are interposed with different amount of the second heat dissipating fins 1412. As shown in FIG. 10E, some adjacent two first heat dissipating fins 1411 are interposed with two second heat dissipating fins 1412, and some adjacent two first heat dissipating fins 1411 are interposed with three second heat dissipating fins 1412. Of course, the amount or amounts of the interposed second heat dissipating fins 1412 and the configuration between the first heat dissipating fins 1411 and the second heat dissipating fins 1412 can be modified based on the actual needs.

Figure 11A:
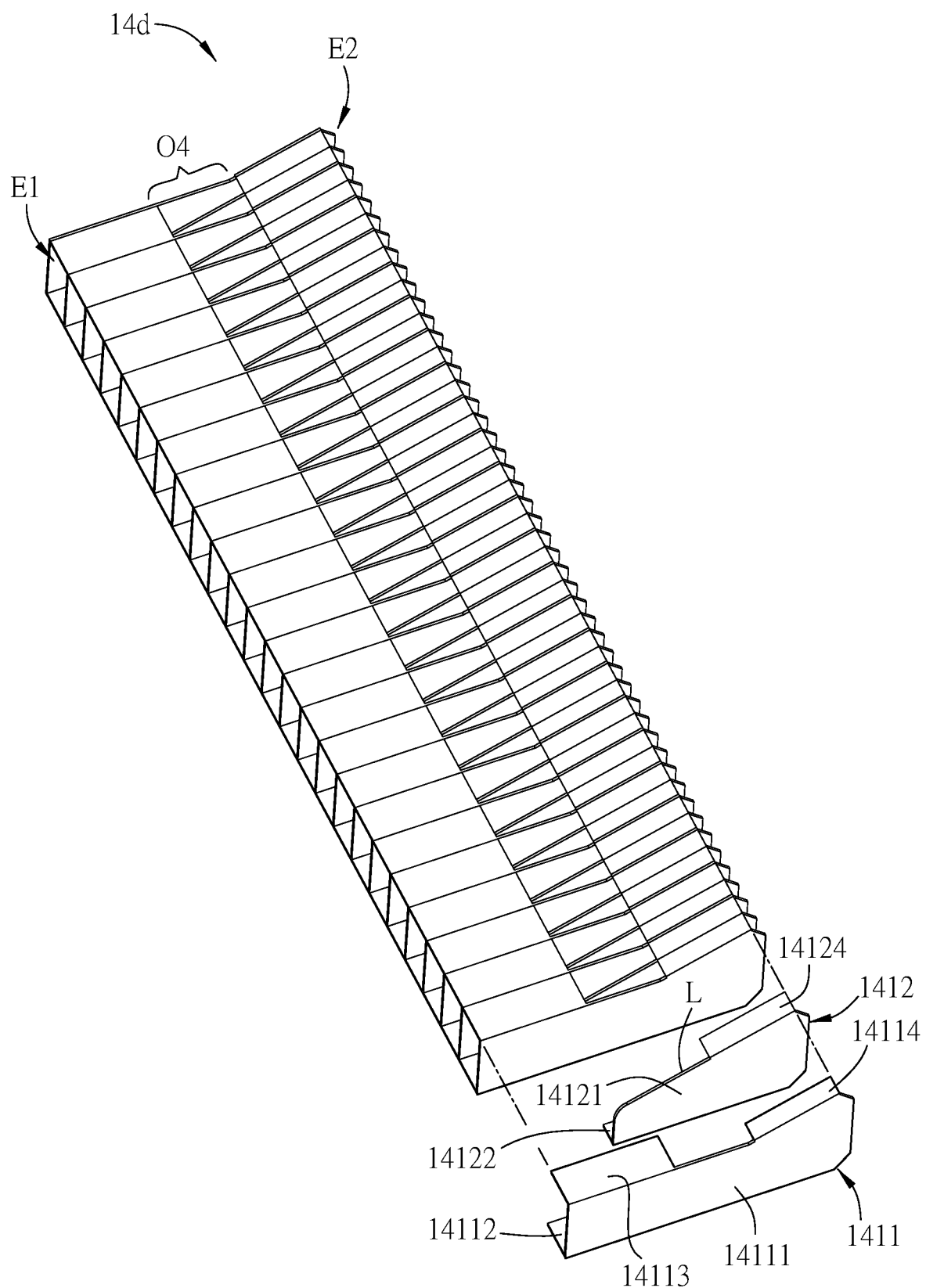
FIG. 11A is a schematic diagram showing another aspect of the heat dissipating fin assembly of FIG. 10A.

FIG. 11A is a schematic diagram showing another aspect of the heat dissipating fin assembly of FIG. 10A. Different from the heat dissipating fin assembly 14a of FIG. 10A, the heat dissipating fin assembly 14d of this aspect includes a plurality of first heat dissipating fins 1411 and a plurality of second heat dissipating fins 1412. Each of the first heat dissipating fins 1411 includes a first fin body 14111, a first bottom extension portion 14112, a first inner cover extension portion 14113 and a first outer cover extension portion 14114. The first bottom extension portion 14112 turns and extends from the first fin body 14111. The first inner cover extension portion 14113 is disposed at the inner end E1 and connected to one side of the first fin body 14111 away from the first bottom extension portion 14112. The first outer cover extension portion 14114 is disposed at the outer end E2 and connected to one side of the first fin body 14111 away from the first bottom extension portion 14112. Each of the second heat dissipating fins 1412 includes a second fin body 14121, a second bottom extension portion 14122 and a second outer cover extension portion 14124. The second bottom extension portion 14122 turns and extends from the second fin body 14121. The second outer cover extension portion 14124 is disposed at the outer end E2 and connected to one side of the second fin body 14121 away from the second bottom extension portion 14122.

In this embodiment, the length of the first heat dissipating fins 1411 is larger than that of the second heat dissipating fins 1412. Herein, the "length" represents the length of the first heat dissipating fins 1411 or the second heat dissipating fins 1412 in the direction from the inner end E1 to the outer end E2. Herein, the first heat dissipating fins 1411 and the second heat dissipating fins 1412 are arranged side by side, and two adjacent first heat dissipating fins 1411 are interposed with one second heat dissipating fin 1412, for example. In practice, the heat dissipating fins 1411 and the second heat dissipating fins 1412 are arranged side by side through a riveting method. Due to the above side-by-side structure, the first inner cover extension portion 14113, the first outer cover extension portion 14114 and the second outer cover extension portion 14124 can form an opening O4. According to the above structure, the inner end E1 of the heat dissipating fin assembly 14d has lower density of heat dissipating structure (the first fin bodies), and the outer end E2 of the heat dissipating fin assembly 14d has higher density of heat dissipating structure (including the first and second fin bodies). The lower density heat dissipating structure at the inner end E1 can avoid the accumulation of dusts, and the higher density heat dissipating structure at the outer end E2 can maintain a larger heat dissipating surface area. The dusts entering the heat dissipating fin assembly 14d through the inner end E1 can be exhausted through the opening O4, thereby achieving the effects of dusting and improved heat dissipating efficiency.

Similarly, in this embodiment, the second fin body 14121 has a slant edge L corresponding to the position of the opening O4. The slant edge L extends obliquely and upwardly from the inner end E1 to the outer end E2. Accordingly, the dusts entering the heat dissipating fin assembly 14d can be more easily ejected, along the slant edge L, through the opening O4.

Figure 11B:
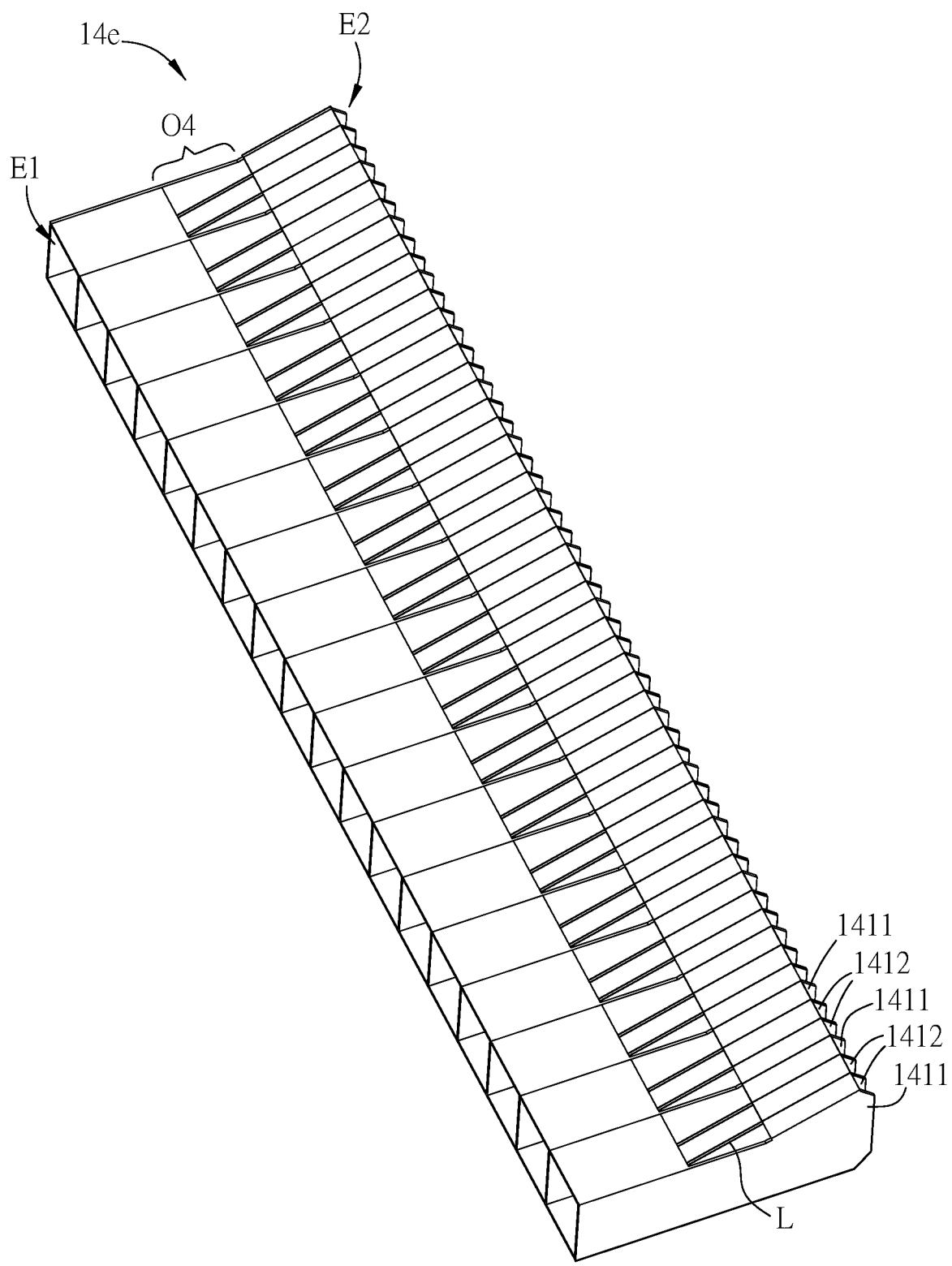
FIG. 11B is a schematic diagram showing another aspect of the heat dissipating fin assembly of FIG. 11A.

FIG. 11B is a schematic diagram showing another aspect of the heat dissipating fin assembly of FIG. 11A. Different from the heat dissipating fin assembly 14d of FIG. 11A, in the heat dissipating fin assembly 14e of this aspect, adjacent two first heat dissipating fins 1411 are interposed with two second heat dissipating fins 1412. Of course, adjacent two first heat dissipating fins 1411 can be interposed with more second heat dissipating fins 1412. Accordingly, a larger interval can be formed around the inner end E1 of the fan, so that the dusts entering the heat dissipating fin assembly 14e can be more easily ejected through the opening O4.

Figure 11C:
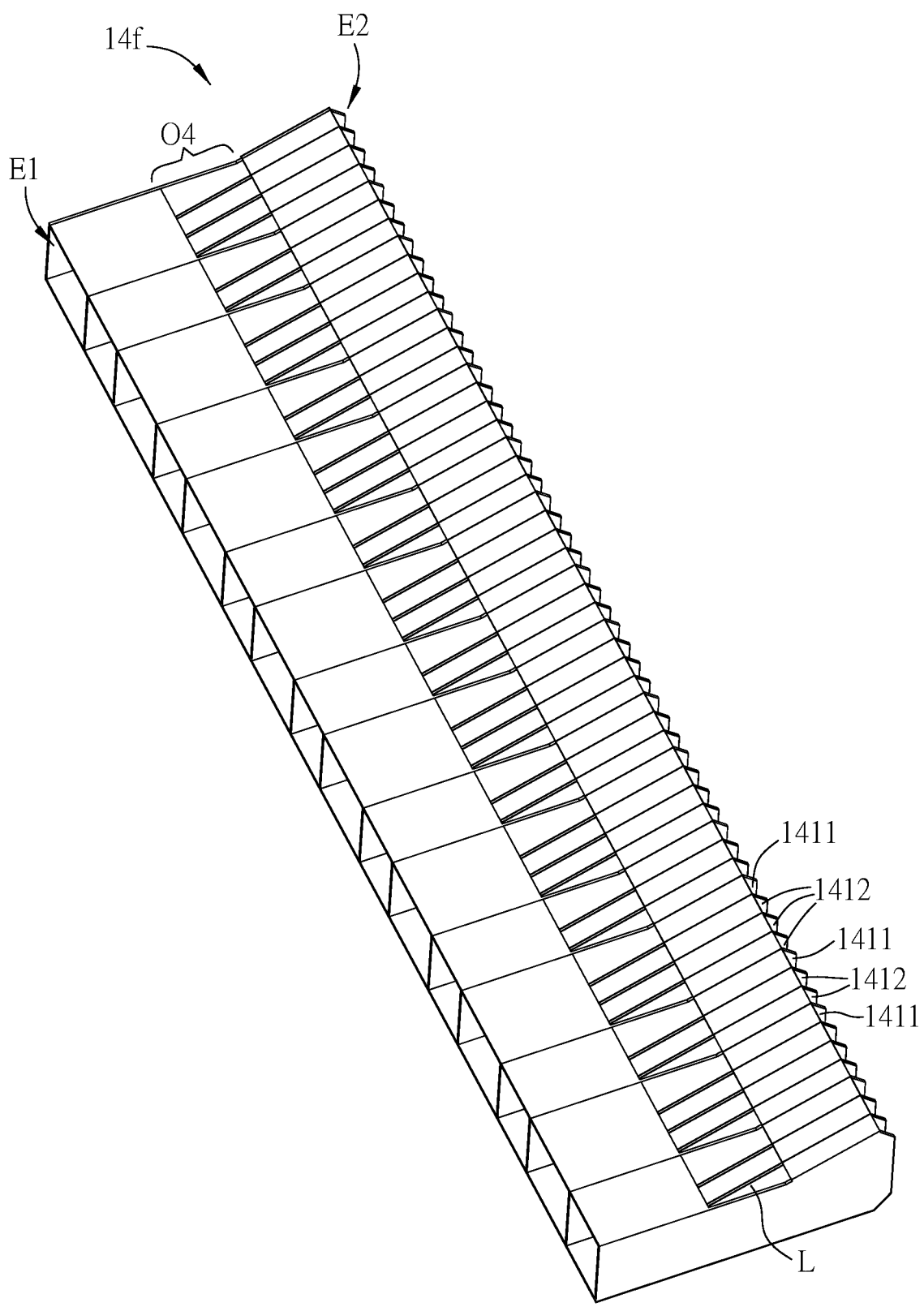
FIG. 11C is a schematic diagram showing another aspect of the heat dissipating fin assembly of FIG. 11A.

FIG. 11C is a schematic diagram showing another aspect of the heat dissipating fin assembly of FIG. 11A. Different from the heat dissipating fin assembly 14e of FIG. 11B, in the heat dissipating fin assembly 14f of this aspect, adjacent two first heat dissipating fins 1411 are interposed with different amount of the second heat dissipating fins 1412. As shown in FIG. 11C, some adjacent two first heat dissipating fins 1411 are interposed with two second heat dissipating fins 1412, and some adjacent two first heat dissipating fins 1411 are interposed with three second heat dissipating fins 1412. Of course, the amount or amounts of the interposed second heat dissipating fins 1412 and the configuration between the first heat dissipating fins 1411 and the second heat dissipating fins 1412 can be modified based on the actual needs.

Figure 12A:
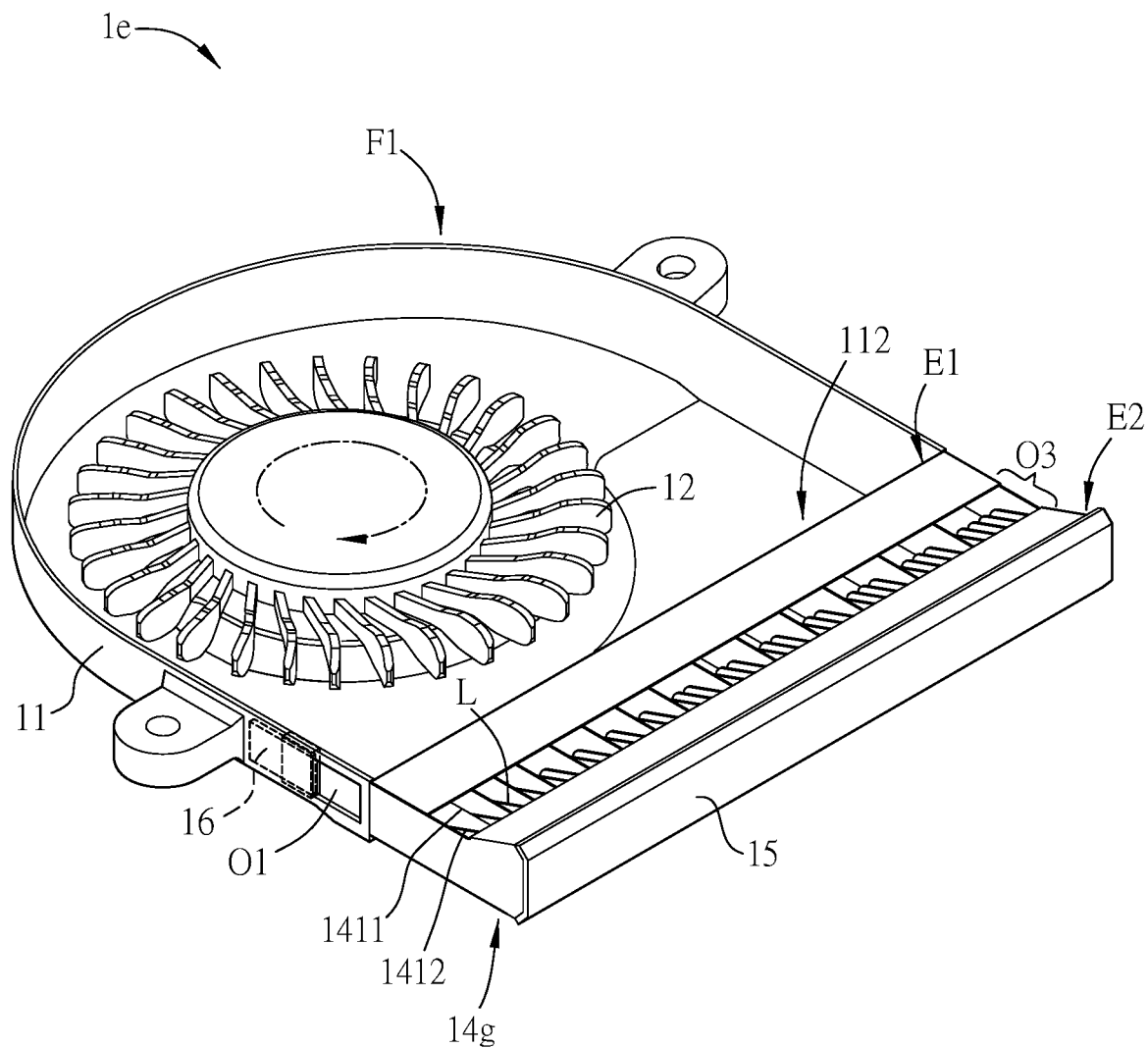
FIG. 12A is a schematic diagram showing a part of an assembled heat dissipating device according to another embodiment of the invention.

FIG. 12A is a schematic diagram showing a part of an assembled heat dissipating device according to another embodiment of the invention. Referring to FIG. 12A, the heat dissipating fin assembly 14g is cooperated with the fan F1 of FIG. 10C so as to form a heat dissipating device 1e. The description of the fan F1 can be referred to the above aspects. Different from the heat dissipating fin assembly 14a of FIG. 10C, in the heat dissipating fin assembly 14g, adjacent two of the first heat dissipating fins 1411 located close to the hole O1 are interposed with less amount of the second heat dissipating fins 1412, while adjacent two of the first heat dissipating fins 1411 located away from the hole O1 are interposed with greater amount of the second heat dissipating fins 1412. Since the hole O1 can provide the dusting function, which means the position close to the hole O1 has better dusting ability, it is possible to arrange the first heat dissipating fins 1411 with the higher density around the hole O1. On the contrary, the position away from the hole O1 has poor dusting ability, so dusts may accumulate at the joint position between the outlet 112 and the heat dissipating fin assembly 14g. Accordingly, this invention is to configure more second heat dissipating fins 1412 between the adjacent first heat dissipating fins 1411 (higher density) around the joint position, so that the dusts entering the heat dissipating fin assembly 14g can be ejected via the opening O3 more easily, thereby improving the dusting ability at the position away from the hole O1.

Figure 12B:
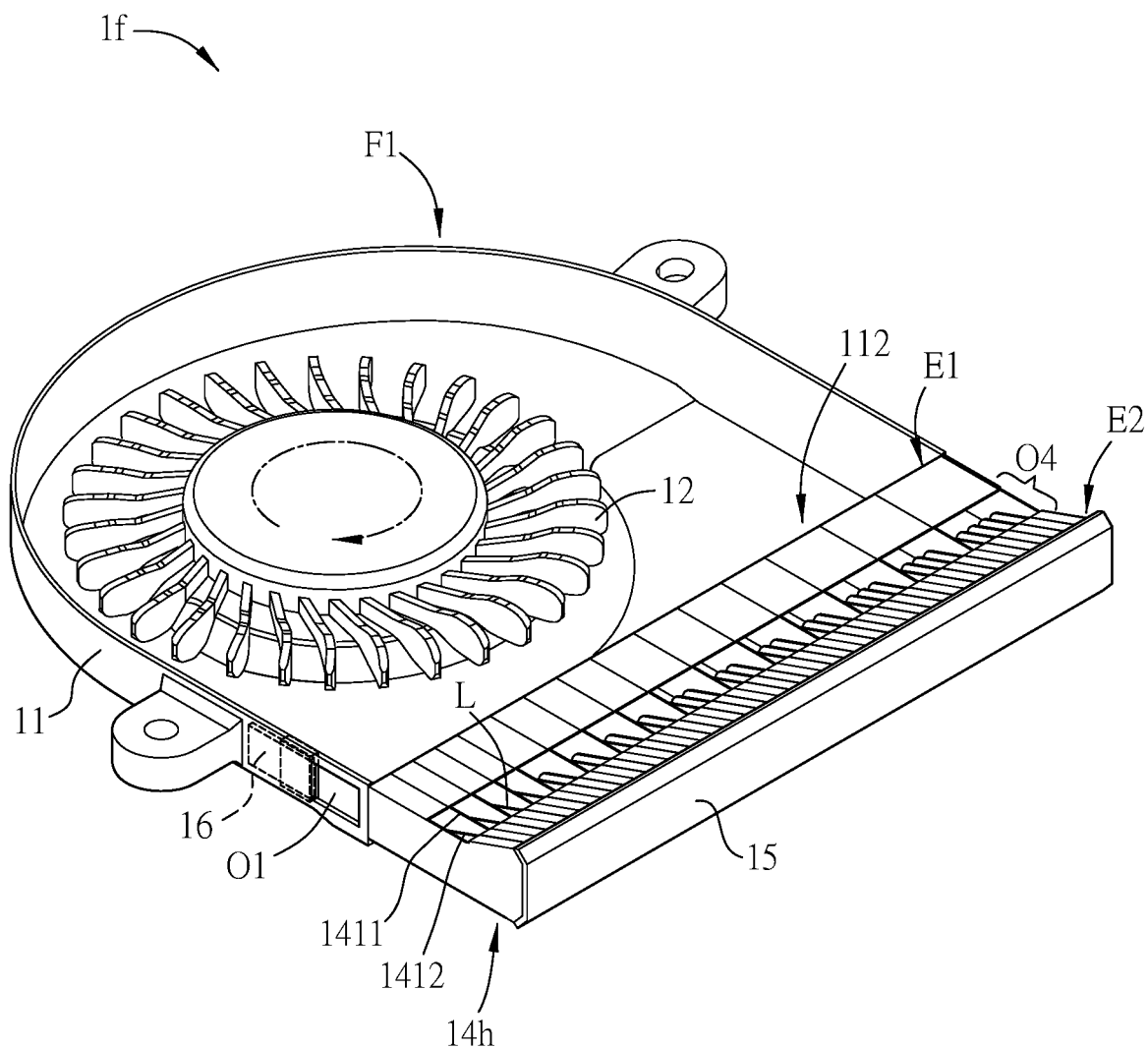
FIG. 12B is a schematic diagram showing a part of an assembled heat dissipating device according to another embodiment of the invention.

FIG. 12B is a schematic diagram showing a part of an assembled heat dissipating device according to another embodiment of the invention. Referring to FIG. 12B, the heat dissipating fin assembly 14h is cooperated with the fan F1 of FIG. 10C. The description of the fan F1 can be referred to the above aspects. Different from the heat dissipating fin assembly 14d of FIG. 11A, in the heat dissipating fin assembly 14h, adjacent two of the first heat dissipating fins 1411 located close to the hole O1 are interposed with less amount of the second heat dissipating fins 1412, while adjacent two of the first heat dissipating fins 1411 located away from the hole O1 are interposed with greater amount of the second heat dissipating fins 1412. Since the hole O1 can provide the dusting function, which means the position close to the hole O1 has better dusting ability, it is possible to arrange the first heat dissipating fins 1411 with the higher density around the hole O1. On the contrary, the position away from the hole O1 is hard to perform dusting procedure by the hole O1, which means the position away from the hole O1 has poor dusting ability, so dusts may accumulate at the joint position between the outlet 112 and the heat dissipating fin assembly 14h. Accordingly, this invention is to configure more second heat dissipating fins 1412 between the adjacent first heat dissipating fins 1411 (higher density) around the joint position, so that the dusts entering the heat dissipating fin assembly 14h can be ejected via the opening O4 more easily, thereby improving the dusting ability at the position away from the hole O1.

Figure 13A:
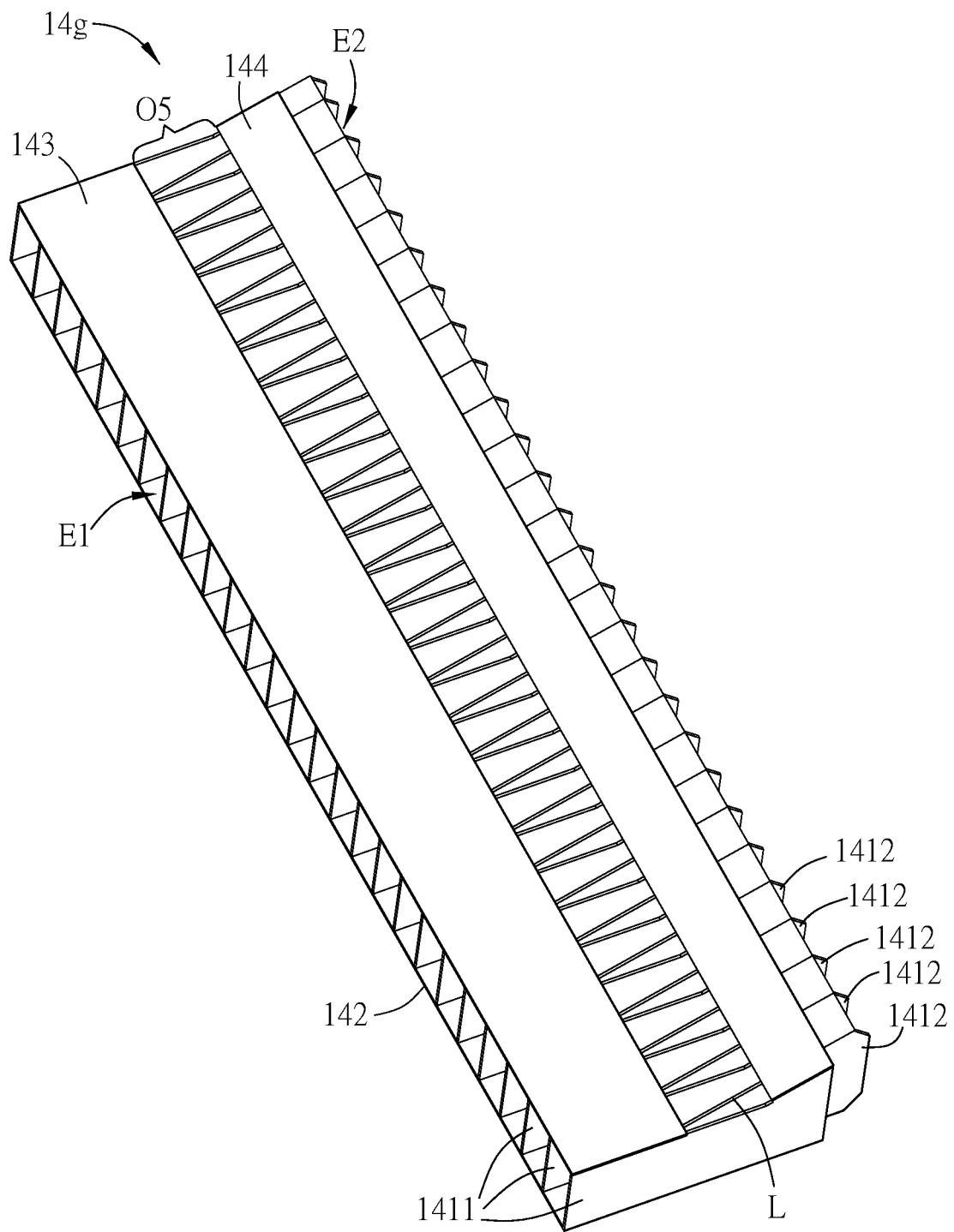
FIG. 13A and FIG. 13B are schematic diagrams showing a heat dissipating fin assembly.
Figure 13B:
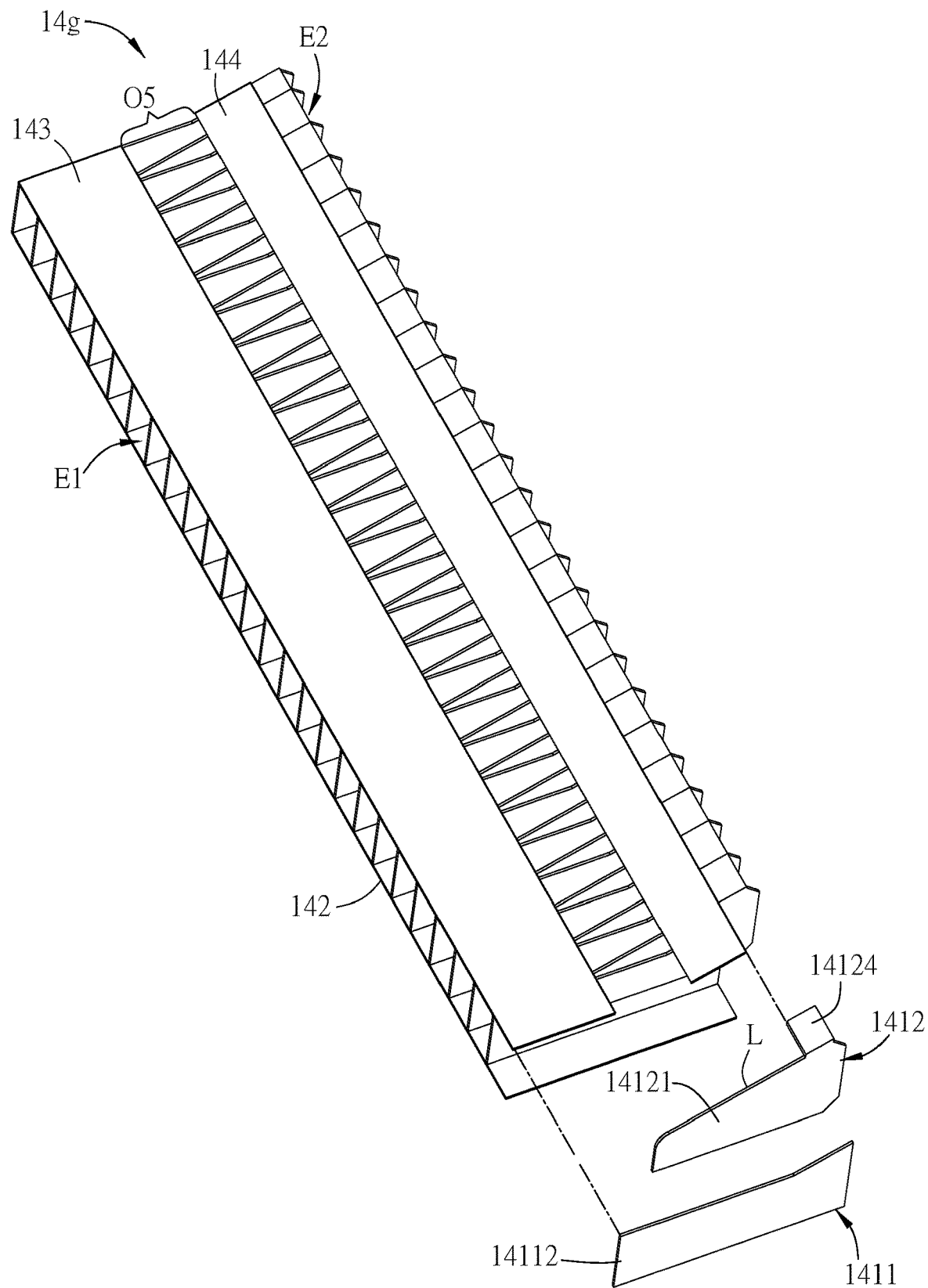
Figure 14A:
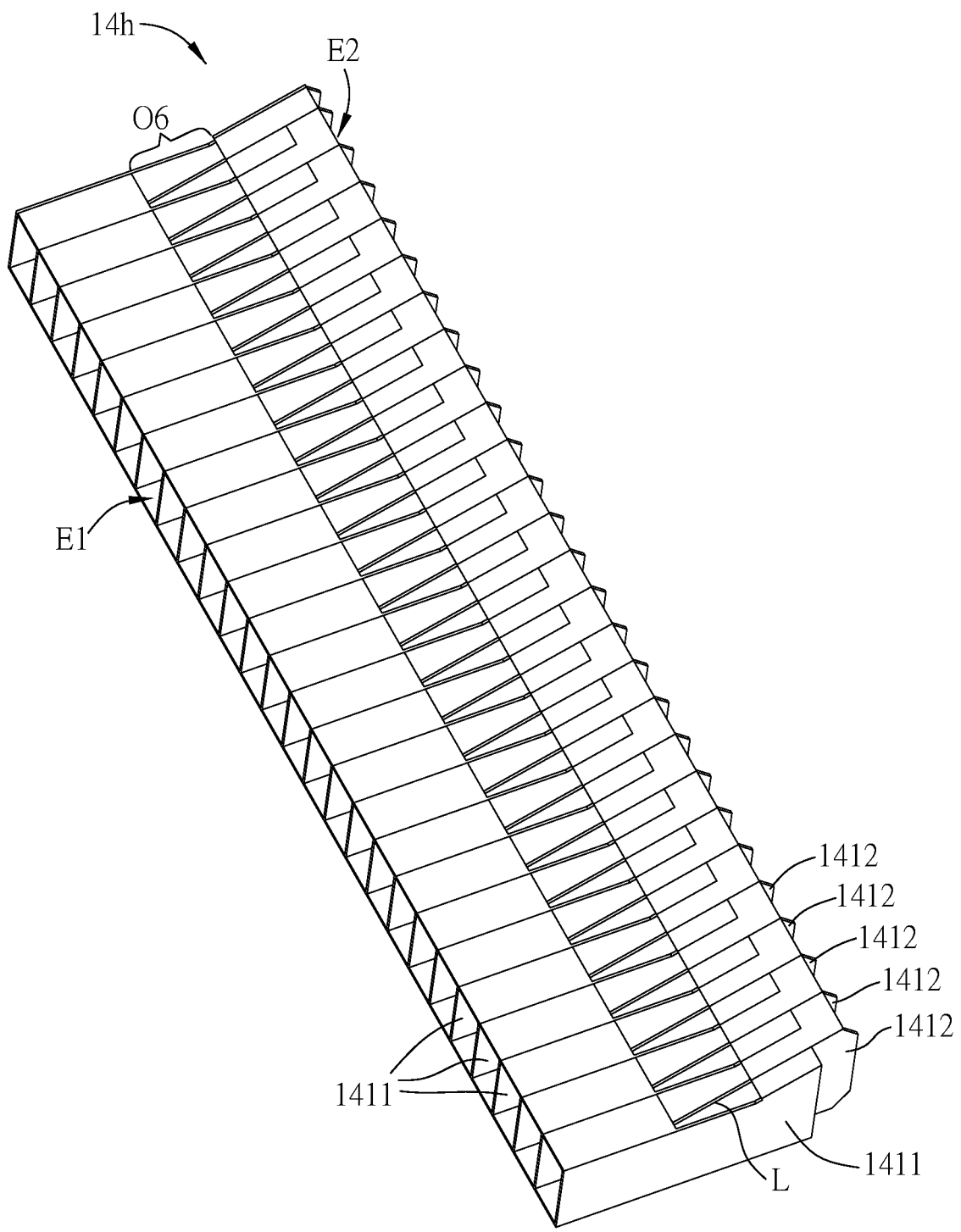
FIG. 14A and FIG. 14B are schematic diagrams showing a heat dissipating fin assembly.
Figure 14B:
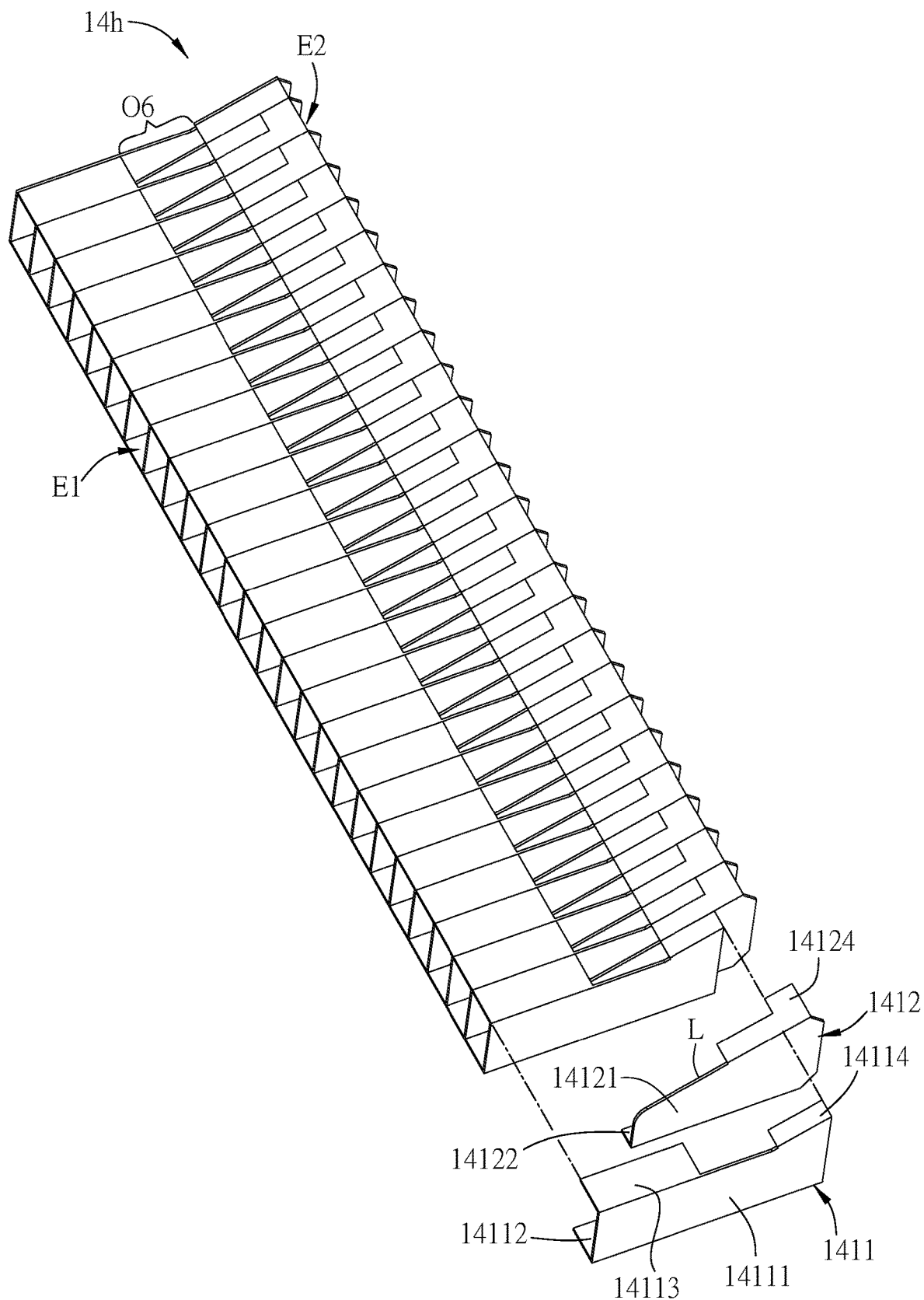

FIG. 13A and FIG. 13B are schematic diagrams showing a heat dissipating fin assembly 14g. FIG. 14A and FIG. 14B are schematic diagrams showing a heat dissipating fin assembly 14h. The heat dissipating fin assembly 14g includes a bottom, a plurality of first heat dissipating fins 1411, a plurality of second heat dissipating fins 1412, an inner cover and an outer cover. In FIG. 13A and FIG. 13B, the bottom is a bottom plate 142, the inner cover is an inner cover plate 143, and the outer cover is an outer cover plate 144. The first heat dissipating fins 1411 are disposed on the bottom plate 142 side by side, aligned with the inner end E1, and extend from the inner end E1 toward the outer end E2 over a half of the bottom plate 142 but not reaching the outer end E2. The second heat dissipating fins 1412 are disposed on the bottom plate 142 and located between two of the first heat dissipating fins 1411, aligned with the outer end E2, and extending from the outer end E2 toward the inner end E1 over a half of the bottom plate 142 but not reaching the inner end E1. The inner cover plate 143 is disposed at the inner end E1 and connected to one side of the first heat dissipating fins 1411 away from the bottom plate 142. The outer cover plate 144 is disposed near the outer end E2 and connected to one side of the second heat dissipating fins 1412 away from the bottom plate 142. The second heat dissipating fins 1412 extend from around the opening O5 to the outer end E2, and the length of the first heat dissipating fins 1411 is larger than that of the second heat dissipating fins 1412. Further, each of the second heat dissipating fins 1412 comprises a second fin body 14121 and a second outer cover extension portion 14124. The second outer cover extension portion 14124 is disposed at the outer end E2 and connected to one side of the second fin body 14121 away from the bottom. The second outer cover extension portions 14124 and the outer cover plate 144 can together form the outer cover. The outer cover is disposed at the outer end E2 and connected to one side of the second heat dissipating fins 1412 away from the bottom plate 142.

In FIG. 14A and FIG. 14B, the bottom, the inner cover and the outer cover are formed from the first heat dissipating fins 1411 and second heat dissipating fins 1412. Each of the first heat dissipating fins 1411 comprises a first fin body 14111, a first bottom extension portion 14112, a first inner cover extension portion 14113 and a first outer cover extension portion 14114. The first bottom extension portion 14112 turns and extends from the first fin body 14111 to form a part of the bottom. The first inner cover extension portion 14113 is disposed at the inner end E1 and connected to one side of the first fin body 14111 away from the first bottom extension portion 14112 to form a part of the inner cover. The first outer cover extension portion 14114 is disposed at the outer end E2 and connected to one side of the first fin body away from the first bottom extension portion 14112 to form a part of the outer cover. Each of the second heat dissipating fins 1412 comprises a second fin body 14121, a second bottom extension portion 14122 and a second outer cover extension portion 14124. The second bottom extension portion 14122 turns and extends from the second fin body 14121 to form a part of the bottom. The second outer cover extension portion 14124 is disposed at the outer end E2 and connected to one side of the second fin body 14121 away from the second bottom extension portion 14122 to form a part of the outer cover. The first bottom extension portions 14112 and the second bottom extension portions 14122 all together form the bottom. The first inner cover extension portions 14113 all together form the inner cover. The first outer cover extension portions 14114 and the second outer cover extension portions 14124 all together form the outer cover. The shape of the second outer cover extension portion 14124 is like word "L". The shapes of the first outer cover extension portion 14114 and the second outer cover extension portion 14124 are combined to obtain a rectangle. A part of the slant edge L of the second fin body 14121 is covered by the first inner cover extension portion 14113 of adjacent one of the first heat dissipating fins 1411.

In summary, the inner end of the heat dissipating fin assembly of the invention has lower density of heat dissipating structure (the first heat dissipating fins), and the outer end of the heat dissipating fin assembly has higher density of heat dissipating structure (including the first and second heat dissipating fins). The lower density heat dissipating structure at the inner end can avoid the accumulation of dusts, and the higher density heat dissipating structure at the outer end can maintain a larger heat dissipating surface area.

The heat dissipating fin assembly further includes an inner cover plate and an outer cover plate, and an opening is defined between the inner and outer cover plates. As a result, the dusts can be exhausted through the opening, thereby achieving the effects of dusting and improved heat dissipating efficiency.

In another embodiment, the inner end of the heat dissipating fin assembly has lower density of heat dissipating structure (the first fin bodies), and the outer end of the heat dissipating fin assembly has higher density of heat dissipating structure (including the first and second fin bodies). In addition, the first inner cover extension portion, the first outer cover extension portion and the second outer cover extension portion form an opening. This configuration can also provide a lower density heat dissipating structure at the inner end to avoid the accumulation of dusts, and a higher density heat dissipating structure at the outer end to maintain a larger heat dissipating surface area. Besides, the dusts entering the heat dissipating fin assembly through the inner end can be ejected via the opening.

Although the present invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present invention.

What is claimed is:

1. A heat dissipating fin assembly suitable for a fan, wherein the heat dissipating fin assembly has an inner end adjacent to the fan and an outer end away from the fan, the heat dissipating fin assembly comprising:
   a fin bottom plate;
   a plurality of first heat dissipating fins disposed on the fin bottom plate in a side-by-side arrangement, and extending from the inner end toward the outer end;
   a plurality of second heat dissipating fins disposed on the fin bottom plate, arranged between two of the first heat dissipating fins in staggered, and extending from the outer end toward the inner end;
   an inner cover disposed near the inner end and connected to one side of the first heat dissipating fins away from the fin bottom plate; and
   an outer cover disposed near the outer end and connected to one side of the second heat dissipating fins away from the fin bottom plate;
   wherein the inner cover and the outer cover are separated to form an opening, and the dusts entering the heat dissipating fin assembly through the inner end are ejected via the opening;
   wherein the second heat dissipating fins extend from the opening to the outer end, and the length of the first heat dissipating fins is longer than that of the second heat dissipating fins,
   wherein any adjacent two of the first heat dissipating fins are interposed with at least one of the second heat dissipating fins.

2. The heat dissipating fin assembly of claim 1, wherein the fan comprises a fan frame, an impeller and a motor, the fan frame has an outlet and a side wall delimiting the outlet, wherein the side wall has a curved section, a straight section and a hole, the straight section is extended straightly from the curved section to the outlet, the hole is at the straight section and adjacent to the outlet and defines an accommodation space, the impeller is disposed in the accommodation space in the fan frame, and the motor is disposed in the fan frame and connecting to the impeller to drive the impeller to rotate;

wherein the heat dissipating fin assembly is disposed at the outlet, the first heat dissipating fins and the second heat dissipating fins form a plurality of heat dissipating channels;

wherein the fan further comprises a block connected with the heat dissipating fin assembly and being moveable between a first open position and a first close position, the block shields the heat dissipating channels when the block is located at the first closing position, the dusts are blew and exhausted through the hole.

3. The heat dissipating fin assembly of claim 2, wherein the block shields one side of the heat dissipating fin assembly adjacent to the impeller.

4. The heat dissipating fin assembly of claim 2, wherein the block shields one side of the heat dissipating fin assembly away from the impeller.

5. The heat dissipating fin assembly of claim 2, wherein the fan frame has a fan frame top plate and a fan frame bottom plate, the side wall is a lateral wall extended from the fan frame bottom plate to the fan frame top plate, wherein the impeller is configured to rotate clockwise, the hole is located at a left side of the side wall when facing the impeller from the outlet; or wherein the impeller is configured to rotate counterclockwise, the hole is located at a right side of the side wall when facing the impeller from the outlet.

6. The heat dissipating fin assembly of claim 2, wherein the fan frame has a fan frame top plate and a fan frame bottom plate, the impeller is between the fan frame top plate and the fan frame bottom plate, the fan frame top plate has an inlet opening, the side wall is a lateral wall extended from the fan frame bottom plate to the fan frame top plate, and the hole is at the straight section of the side wall.

7. The heat dissipating fin assembly of claim 1, wherein each of the first heat dissipating fins comprises:
a first fin body;
a first bottom extension portion, turning and extending from the first fin body to form a part of the fin bottom plate;
a first inner cover extension portion, disposed at the inner end and connected to one side of the first fin body away from the first bottom extension portion to form a part of the inner cover; and
a first outer cover extension portion, disposed at the outer end and connected to one side of the first fin body away from the first bottom extension portion to form a part of the outer cover,
wherein each of the second heat dissipating fins comprises:
a second fin body;
a second bottom extension portion, turning and extending from the second fin body to form a part of the fin bottom plate; and
a second outer cover extension portion, disposed at the outer end and connected to one side of the second fin body away from the second bottom extension portion to form a part of the outer cover.

8. A heat dissipating fin assembly suitable for a fan, wherein the heat dissipating fin assembly has an inner end adjacent to the fan and an outer end away from the fan, the heat dissipating fin assembly comprising:
a fin bottom plate;
a plurality of first heat dissipating fins disposed on the fin bottom plate in a side: by: side arrangement, aligned with the inner end, and extending from the inner end toward the outer end over a half of the fin bottom plate but not reaching the outer end;
a plurality of second heat dissipating fins disposed on the fin bottom plate and located between two of the first heat dissipating fins, aligned with the outer end, and extending from the outer end toward the inner end over a half of the fin bottom plate but not reaching the inner end;
an inner cover disposed at the inner end and connected to one side of the first heat dissipating fins away from the fin bottom plate; and
an outer cover disposed at the outer end and connected to one side of the second heat dissipating fins away from the fin bottom plate;
wherein, the second heat dissipating fins extend from the opening to the outer end, and the length of the first heat dissipating fins is longer than that of the second heat dissipating fins.

9. The heat dissipating fin assembly of claim 8, wherein the outer cover and the inner cover are completely separated so as to form an opening between the outer cover and the inner cover, wherein each of the second heat dissipating fins has a slant edge corresponding to the position of the opening, and the slant edge extends obliquely and upwardly from the inner end to the outer end.

10. The heat dissipating fin assembly of claim 8, wherein the fan is a centrifugal fan.

11. The heat dissipating fin assembly of claim 8, wherein any adjacent two of the first heat dissipating fins are interposed with one of the second heat dissipating fins.

12. The heat dissipating fin assembly of claim 8, wherein any adjacent two of the first heat dissipating fins are interposed with at least two of the second heat dissipating fins.

13. The heat dissipating fin assembly of claim 8, wherein any adjacent two of the first heat dissipating fins are interposed with an amount of the second heat dissipating fins.

14. The heat dissipating fin assembly of claim 8, wherein a hole is configured on a side wall of a fan frame of the fan adjacent to an outlet.

15. The heat dissipating fin assembly of claim 14, wherein any adjacent two of the first heat dissipating fins located close to the hole are interposed with less amount of the second heat dissipating fins, while any adjacent two of the first heat dissipating fins located away from the hole are interposed with greater amount of the second heat dissipating fins.

16. The heat dissipating fin assembly of claim 8, wherein the inner end of the heat dissipating fin assembly has a lower heat-dissipating-fin density to avoid accumulation of dusts, the outer end of the heat dissipating fin assembly has a higher heat-dissipating-fin density to maintain a larger heat dissipating surface area, and the higher heat-dissipating-fin density is higher than the lower heat-dissipating-fin density.

17. The heat dissipating fin assembly of claim 8, wherein the inner cover is an inner cover plate, and the outer cover is an outer cover plate.

18. The heat dissipating fin assembly of claim 8, wherein each of the first heat dissipating fins comprises:
a first fin body;
a first bottom extension portion, turning and extending from the first fin body to form a part of the fin bottom plate;
a first inner cover extension portion, disposed at the inner end and connected to one side of the first fin body away from the first bottom extension portion to form a part of the inner cover; and a first outer cover extension portion, disposed at the outer end and connected to one side of the first fin body away from the first bottom extension portion to form a part of the outer cover.

19. The heat dissipating fin assembly of claim 18, wherein each of the second heat dissipating fins comprises:
a second fin body;
a second bottom extension portion, turning and extending from the second fin body to form a part of the fin bottom plate; and
a second outer cover extension portion, disposed at the outer end and connected to one side of the second fin body away from the second bottom extension portion to form a part of the outer cover.

20. The heat dissipating fin assembly of claim 19, wherein shapes of the first outer cover extension portion and the second outer cover extension portion are combined to obtain a rectangle, and the shape of the second outer cover extension portion is like word "L".

21. The heat dissipating fin assembly of claim 19, wherein each of the second heat dissipating fins has a slant edge corresponding to the position of the opening, and the slant edge extends obliquely and upwardly from the inner end to the outer end, a part of the slant edge of the second fin body is covered by the first inner cover extension portion of adjacent one of the first heat dissipating fins.

* * * * *